US012713154B2

(12) United States Patent
Jeong

(10) Patent No.: US 12,713,154 B2
(45) Date of Patent: Aug. 18, 2026

(54) IMAGE SENSOR AND METHOD OF OPERATING THE SAME

(71) Applicant: SAMSUNG ELECTRONICS CO., LTD., Suwon-si (KR)

(72) Inventor: Kyungah Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 206 days.

(21) Appl. No.: 18/440,175

(22) Filed: Feb. 13, 2024

(65) Prior Publication Data

US 2025/0047998 A1 Feb. 6, 2025

(30) Foreign Application Priority Data

Aug. 1, 2023 (KR) ........................ 10-2023-0100602

(51) Int. Cl.
*H04N 25/77* (2023.01)
*H03M 1/12* (2006.01)

(52) U.S. Cl.
CPC .............. *H04N 25/77* (2023.01); *H03M 1/12* (2013.01)

(58) Field of Classification Search
CPC ........ H04N 25/77; H04N 25/78; H04N 25/70; H04N 25/772; H04N 25/60; H04N 25/7795; H03M 1/12
See application file for complete search history.

(56) References Cited

U.S. PATENT DOCUMENTS

| | | | | |
|---|---|---|---|---|
| 7,405,689 | B2 | 7/2008 | Kernahan et al. | |
| 8,949,640 | B2 | 2/2015 | Minami | |
| 9,000,968 | B1 | 4/2015 | Gupta et al. | |
| 9,154,152 | B1 | 10/2015 | Chiu et al. | |
| 10,523,227 | B2 | 12/2019 | Takase et al. | |
| 2006/0103745 | A1 * | 5/2006 | Nagaishi | H04N 25/57 348/E3.02 |
| 2015/0312479 | A1 * | 10/2015 | McMahon | H04N 25/617 348/302 |
| 2023/0401366 | A1 * | 12/2023 | Yamaoka | G06F 30/3323 |

FOREIGN PATENT DOCUMENTS

| | | | |
|---|---|---|---|
| JP | 5905300 | B2 | 4/2016 |
| KR | 10-1283752 | B1 | 7/2013 |

* cited by examiner

*Primary Examiner* — Mekonnen D Dagnew
(74) *Attorney, Agent, or Firm* — Sughrue Mion, PLLC

(57) ABSTRACT

Provided is an image sensor and a method of operating same, the image sensor including: an analog signal processing circuitry configured to process analog signals and to output digital signals; a digital data processing circuitry including one or more digital circuits configured to process the digital signals; and a control circuit configured to control operations of the one or more digital circuits based on operation schedule information, wherein the operation schedule information includes one or more control time intervals associated with one or more operation sequences of the image sensor.

18 Claims, 21 Drawing Sheets

FIG. 2

OPSI

| Operation Mode | Operation Sequence | Control Time Interval |
|---|---|---|
| OPM1 | OPSEQ1 | CTINV1 |
| OPM2 | OPSEQ2 | CTINV2 |
| OPM3 | OPSEQ3 | CTINV3 |
| ⋮ | ⋮ | ⋮ |

500
OPMDI, OPSI
Timing Controller
551
550
Row Driver
553
Ramp Generator
555
CTL1
VRMP
CTL2(CLK, PWR)
Pixel Array
511
510
PS
ADC Circuit
513
DS
Readout Circuit
531
530
Image Signal Processor
533
DD
Column Driver
557

FIG. 6C

1H_TINTV3
t51
t55
LRTINV3
SLP2
HRTINV3
SLP1
HSTINV3
SLP1
LSTINV3
SLP2
OPSEQ3
"R-R-S-S"

OPSEQ
ta
tb
1H_TINTV
RTINVa = TSa31
STINVa = TSa32
Time

FIG. 7D

OPSEQ
ta
tb
1H_TINTV
RTINVa
STINVa
TSa41
TSa42
TSa43
Time

Figure 11A:
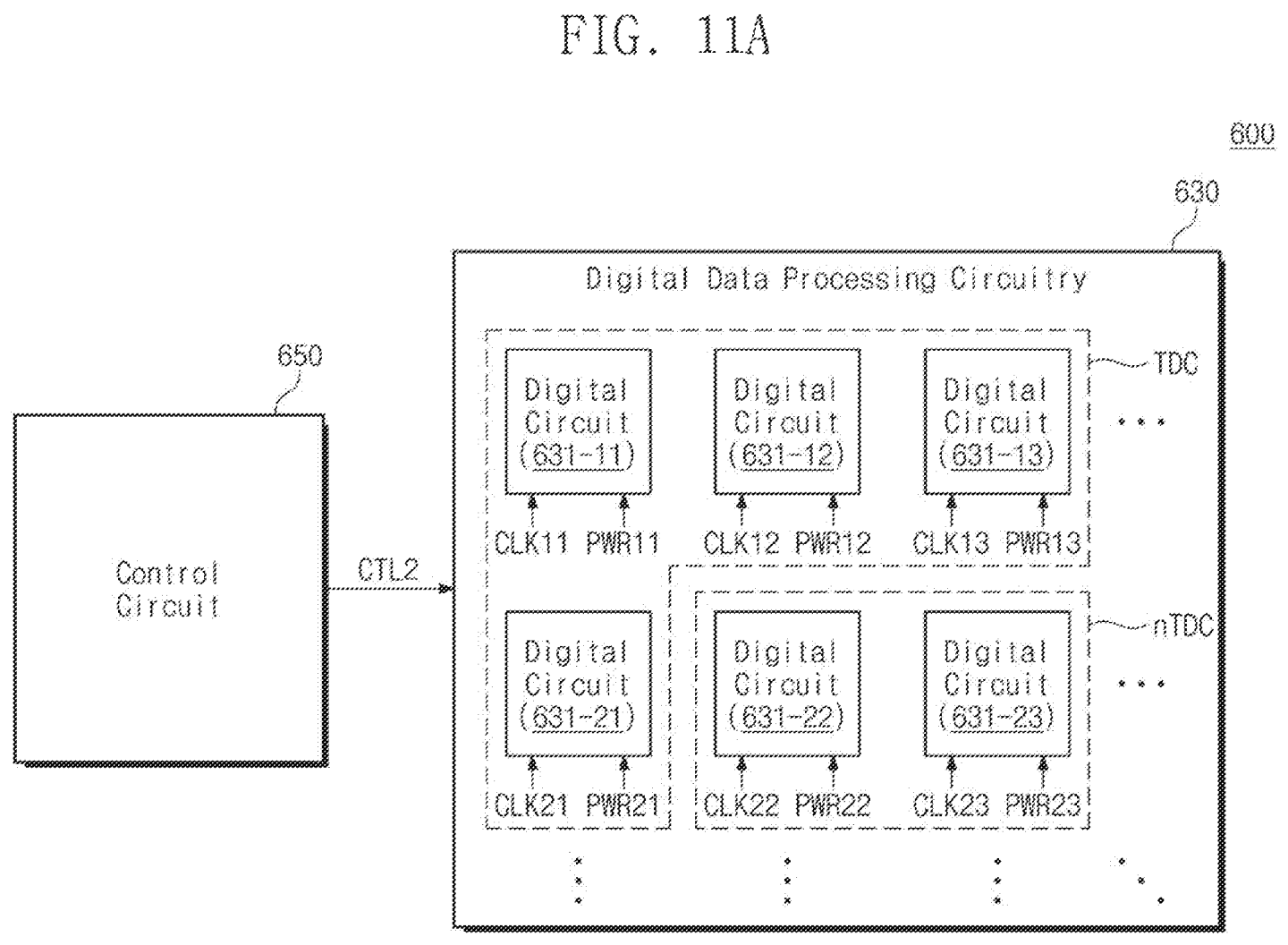

Digital Data Processing Circuitry

TDC nTDC

Digital Circuit (631-11)

Digital Circuit (631-12)

Digital Circuit (631-13)

Digital Circuit (631-21)

Digital Circuit (631-22)

Digital Circuit (631-23)

CLK11 PWR11

CLK12 PWR12

CLK13 PWR13

CLK21 PWR21

CLK22 PWR22

CLK23 PWR23

CTL2

650

Control Circuit

FIG. 12A

OPSIa

| Operation Mode | Operation Sequence | Control Time Interval |
|---|---|---|
| OPM1 | OPSEQ1 | CTINV1 |
| OPM2 | | |
| OPM3 | OPSEQ2 | CTINV2 |
| OPM4 | | |
| OPM5 | | |
| ⋮ | ⋮ | ⋮ |

FIG. 12B

OPSIb

| Operation Mode | Operation Sequence | Control Time Interval | Target Digital Circuit |
|---|---|---|---|
| OPM1 | OPSEQ1 | CTINV1 | 1-2, 4 |
| OPM2 | OPSEQ2 | CTINV2 | 1-2 |
| OPM3 | OPSEQ3 | CTINV3 | 1, 4-6 |
| ⋮ | ⋮ | ⋮ | ⋮ |

IMAGE SENSOR AND METHOD OF OPERATING THE SAME

CROSS-REFERENCE TO RELATED APPLICATION

This application claims priority under 35 U.S.C. § 119 to Korean Patent Application No. 10-2023-0100602 filed on Aug. 1, 2023, in the Korean Intellectual Property Office, the disclosure of which is incorporated by reference herein in its entirety.

BACKGROUND

1. Field

The present disclosure relates to a semiconductor device, and more particularly, to an image sensor and an operating method thereof.

2. Description of Related Art

An image sensor includes an analog signal processing circuitry and a digital data processing circuitry and converts a light incident through a camera lens into digital data by using the analog signal processing circuitry and the digital data processing circuitry. The analog signal processing circuitry may output digital signals by receiving the light, generating analog signals based on the received light, and processing the analog signals. The digital data processing circuitry may process the digital signals to output digital data.

In general, the analog signal processing circuitry and the digital data processing circuitry may be implemented in one semiconductor chip. In this case, because the analog signal processing circuitry and the digital data processing circuitry share one ground voltage, operations of the digital data processing circuit may affect a noise characteristic of the analog signal processing circuitry.

SUMMARY

The present disclosure provides an image sensor capable of improving a noise characteristic and reducing power consumption.

The present disclosure further provides an operating method of the image sensor.

According to an aspect of the disclosure, an image sensor includes: an analog signal processing circuitry configured to process analog signals and to output digital signals; a digital data processing circuitry comprising one or more digital circuits configured to process the digital signals; and a control circuit configured to control operations of the one or more digital circuits based on operation schedule information, wherein the operation schedule information comprises one or more control time intervals associated with one or more operation sequences of the image sensor.

According to an aspect of the disclosure, a method of operating an image sensor includes: identifying an operation mode of the image sensor; determining an operation sequence based on the operation mode; and controlling operations of one or more digital circuits of the image sensor based on operation schedule information comprising a control time interval associated with the operation sequence.

According to an aspect of the disclosure, an image sensor includes: an analog signal processing circuitry configured to process analog signals and to output digital signals; a digital data processing circuitry comprising one or more digital circuits configured to process the digital signals; and a control circuit configured to, in each of one or more operation sequences of the image sensor, provide a first control signal to the analog signal processing circuitry, wherein the control circuit is further configured to control operations of the one or more digital circuits based on operation sequence information, wherein the operation sequence information comprises one or more control time intervals associated with the one or more operation sequences, and wherein the one or more control time intervals are set based on the first control signal.

According to an aspect of the disclosure, an image sensor includes: an analog signal processing circuitry, the analog signal processing circuitry comprising: a pixel array; an analog-to-digital signal converter; and a ramp generator; a digital data processing circuitry comprising one or more digital circuits; and a control circuit, wherein the analog signal processing circuitry is configured to process an analog signal generated by the pixel array and to output a digital signal, wherein the one or more digital circuits are configured to store the digital signal and perform image signal processing to enhance a characteristic of the digital signal, wherein the one or more digital circuits are classified into a first digital circuit block and a second digital circuit block based on a statistical analysis associated with a noise characteristic of the analog signal processing circuitry, and wherein the control circuit is configured to: control operations of the one or more digital circuits based on operation schedule information, wherein the operation schedule information comprises one or more control time intervals associated with one or more operation sequences of the image sensor, provide one or more clock signals to the one or more digital circuits, and block a clock signal to be provided to the first digital circuit block.

BRIEF DESCRIPTION OF DRAWINGS

The above and other aspects, objects and features of the present disclosure will become apparent by describing in detail embodiments thereof with reference to the accompanying drawings, in which:

FIG. 2 is a diagram illustrating an embodiment of operation schedule information of FIG. 1;

FIGS. 6A, 6B, and 6C are timing diagrams for describing one or more operation sequences of an image sensor of FIG. 3;

FIGS. 7A, 7B, 7C, 7D, and 7E are diagrams for describing one or more control time intervals associated with one or more operation sequences of an image sensor of FIG. 3;

FIG. 11A is a diagram for describing operations of one or more digital circuits included in a digital data processing circuitry of FIG. 1;

FIGS. 12A and 12B are diagrams illustrating embodiments of operation schedule information of FIG. 1;

DETAILED DESCRIPTION

Below, embodiments of the present disclosure will be described in detail and clearly to such an extent that one skilled in the art easily carries out the present disclosure.

Terms such as "unit", "module", "member", and "block" may be embodied as hardware or software. According to certain embodiments, a plurality of "unit", "module", "member", and "block" may be implemented as a single component or a single "unit", "module", "member", and "block" may include a plurality of components.

It will be understood that when an element is referred to as being "connected" with or to another element, it can be directly or indirectly connected to the other element, wherein the indirect connection includes "connection via a wireless communication network".

Also, when a part "includes" or "comprises" an element, unless there is a particular description contrary thereto, the part may further include other elements, not excluding the other elements.

Throughout the description, when a member is "on" another member, this includes not only when the member is in contact with the other member, but also when there is another member between the two members.

Herein, the expression "at least one of a, b or c" indicates "only a," "only b," "only c," "both a and b," "both a and c," "both b and c," or "all of a, b, and c."

It will be understood that, although the terms first, second, third, etc., may be used herein to describe various elements, is the disclosure should not be limited by these terms. These terms are only used to distinguish one element from another element.

As used herein, the singular forms "a," "an" and "the" are intended to include the plural forms as well, unless the context clearly indicates otherwise.

An identification code is used for the convenience of the description but is not intended to illustrate the order of each step. Each step may be implemented in an order different from the illustrated order unless the context clearly indicates otherwise.

Figure 1:
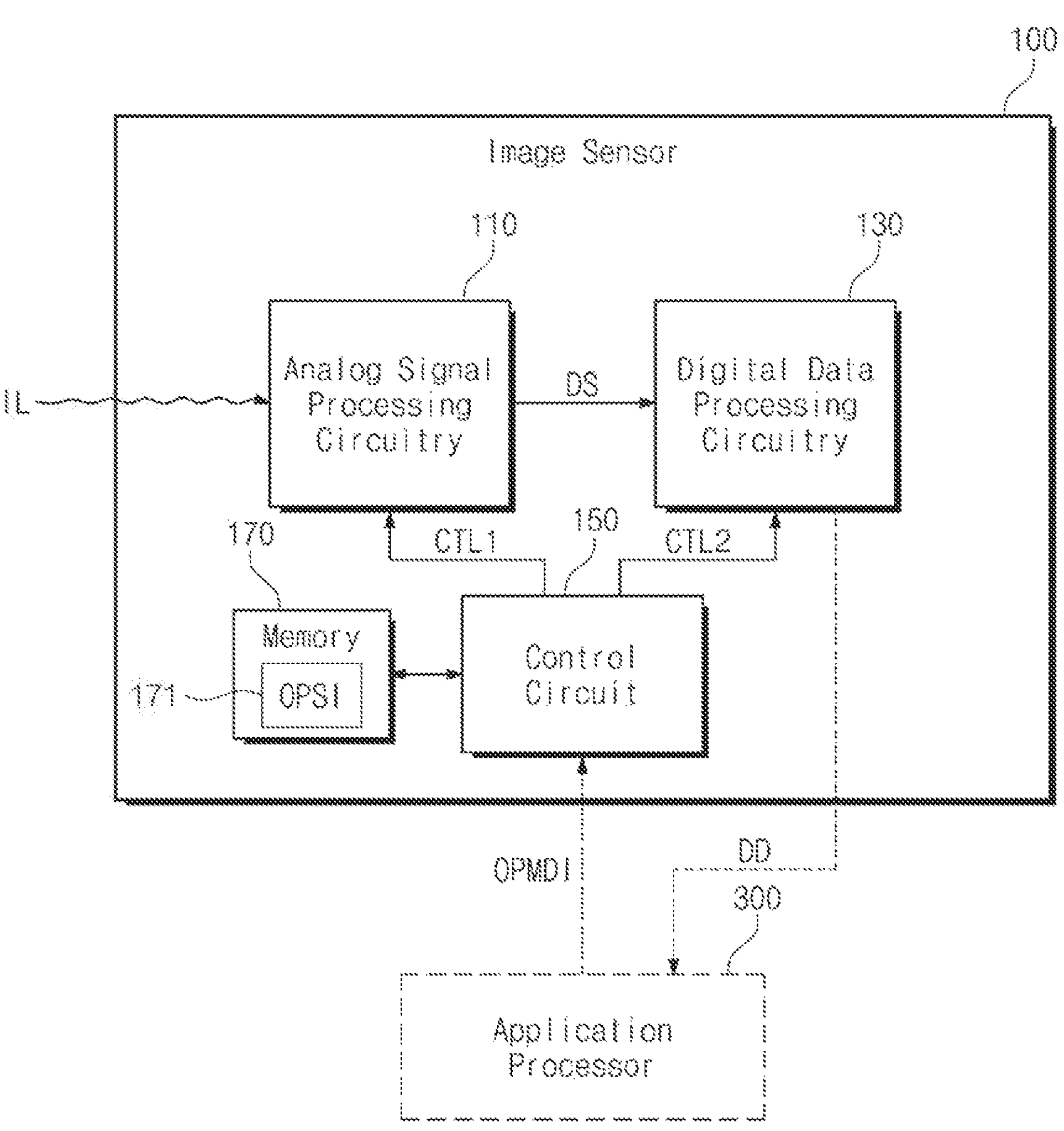
FIG. 1 is a block diagram illustrating an image sensor according to an embodiment of the present disclosure.

FIG. 1 is a block diagram illustrating an image sensor according to an embodiment of the present disclosure.

Referring to FIG. 1, an image sensor 100 may include an analog signal processing circuitry 110, a digital data processing circuitry 130, a control circuit 150, and a memory 170.

The analog signal processing circuitry 110 may sense a light IL incident from the outside through a lens and may generate digital signals DS through photoelectric conversion. For example, the analog signal processing circuitry 110 may generate photo charges in proportion to the intensity of light IL and may generate analog signals based on the photo charges thus generated. The analog signal processing circuitry 110 may perform analog-to-digital conversion with respect to the analog signals and may output a result of performing the analog-to-digital conversion as the digital signals DS. For example, the analog signal processing circuitry 110 may output the digital signals DS to the digital data processing circuitry 130.

The digital data processing circuitry 130 may generate digital data DD by processing the digital signals DS received from the analog signal processing circuitry 110. For example, the digital data processing circuitry 130 may temporarily store the digital signals DS, may perform image signal processing for enhancement of the quality of image with respect to the digital signals DS, and may output a result of performing the image signal processing as the digital data DD. For example, the digital data processing circuitry 130 may output the digital data DD to an application processor 300 provided outside the image sensor 100.

The control circuit 150 may generate control signals CTL1 and CTL2 for controlling the operations of the analog signal processing circuitry 110 and the digital data processing circuitry 130, may provide the control signal CTL1 to the analog signal processing circuitry 110, and may provide the control signal CTL2 to the digital data processing circuitry 130.

The memory 170 may store information necessary for the control circuit 150 to control the operations of the analog signal processing circuitry 110 and the digital data processing circuitry 130. For example, the memory 170 may store operation schedule information (OPSI) 171, and the control circuit 150 may control the operations of the analog signal processing circuitry 110 and the digital data processing circuitry 130 based on the operation schedule information 171. For example, the operation schedule information 171 may include one or more control time intervals associated with one or more operation sequences. For example, the digital data processing circuitry 130 may include one or more digital circuits, and the control circuit 150 may control operations of the one or more digital circuits based on the operation schedule information 171. The operation schedule information 171 will be described with reference to FIGS. 2, 12A, and 12B.

In an embodiment, a control time interval may be a time interval in which the operations of the digital data processing circuitry 130, which have an influence on the operations of the analog signal processing circuitry 110, have a negative influence on a noise characteristic of the analog signal processing circuitry 110.

For example, the operations (e.g., operations of generating the photo charges, the analog signals, or the digital signals DS) of the analog signal processing circuitry 110 and the operations (e.g., operations of storing the digital signals DS or performing the image signal processing) of the digital data processing circuitry 130 may be performed in parallel in time, and the operations of the digital data processing circuitry 130 may affect the quality of the digital signals DS output from the analog signal processing circuitry 110. In this case, the control time interval may indicate a time interval in which the quality of the digital signals DS decreases to a given level or lower, and the control circuit 150 may block one or more clock signals or one or more power signals provided to the digital data processing circuitry 130 during the control time interval. The control time interval will be described with reference to FIGS. 7A, 7B, 7C, 7D, and 7E.

In an embodiment, the operation schedule information 171 may include one or more operation modes of the image sensor 100, one or more operation sequences corresponding to the one or more operation modes, and one or more control time intervals corresponding to the one or more operation sequences. The one or more operation sequences will be described with reference to FIGS. 6A, 6B, and 6C.

In an embodiment, the digital data processing circuitry 130 may include one or more digital circuits for temporarily storing the digital signals DS or performing image signal processing with respect to the digital signals DS, and the operation schedule information 171 may further include information about a target digital circuit, in which the supply of the one or more clock signals or the one or more power signals is blocked during the control time interval, from among the one or more digital circuits. The target digital circuit will be described with reference to FIG. 11A.

In an embodiment, the operation schedule information 171 may be stored in advance in the memory 170 before the image sensor 100 performs main operations for capturing an image (e.g., operations based on one operation sequence according to one operation mode). For example, the control circuit 150 may receive operation mode information OPMDI indicating a specific operation mode from the application processor 300 and may block one or more clock signals or one or more power signals to be provided to the target digital circuit during the control time interval based on the operation mode information OPMDI and the operation schedule information 171.

Through the above configuration, an image sensor according to an embodiment of the present disclosure may improve a noise characteristic of an analog signal processing circuitry by blocking one or more clock signals or one or more power signals to be provided to a digital data processing circuitry of the image sensor during a control time interval.

Until an operation mode or an operation sequence is changed, the image sensor may perform operations scheduled in advance every given time interval (e.g., "unit time interval"); the control time interval may be defined in advance as a portion of the unit time interval. Accordingly, depending on a predefined schedule, the image sensor according to an embodiment of the present disclosure may improve a noise characteristic of the analog signal processing circuitry and may reduce power consumption, without checking detailed states of various circuits included in the analog signal processing circuitry or the digital signal processing circuitry in real time.

FIG. 2 is a diagram illustrating an embodiment of operation schedule information of FIG. 1.

Referring to FIGS. 1 and 2, operation schedule information OPSI may include an operation mode, an operation sequence, and a control time interval.

In an embodiment, the operation mode may include operation modes OPM1, OPM2, and OPM3, the operation sequence may include operation sequences OPSEQ1, OPSEQ2, and OPSEQ3, and the control time interval may include control time intervals CTINV1, CTINV2, and CTINV3. An example in which the operation sequences OPSEQ1, OPSEQ2, and OPSEQ3 respectively correspond to the operation modes OPM1, OPM2, and OPM3 and the control time intervals CTINV1, CTINV2, and CTINV3 respectively correspond to operation sequences OPSEQ1, OPSEQ2, and OPSEQ3 is illustrated in FIG. 2, but the correspondence relationships between the operation modes OPM1, OPM2, and OPM3, the operation sequences OPSEQ1, OPSEQ2, and OPSEQ3, and the control time intervals CTINV1, CTINV2, and CTINV3 are provided as an example.

In an embodiment, each of the operation modes OPM1, OPM2, and OPM3 may indicate various manners in which the image sensor 100 performs main operations to capture an image. For example, each of the operation modes OPM1, OPM2, and OPM3 may include one of a global exposure mode, a partial exposure mode, and a multiple exposure mode and may include one of a fast shutter mode and slow shutter mode. For example, each of the operation modes OPM1, OPM2, and OPM3 may include one of a global sync mode, a rolling shutter mode, and a hybrid shutter mode and may include one of a video mode and a still image mode.

In an embodiment, the image sensor 100 may perform predefined operations every unit time interval. For example, the image sensor 100 may operate in one or more reset time intervals and one or more signal time intervals included in the unit time interval.

In an embodiment, each of the operation sequences OPSEQ1, OPSEQ2, and OPSEQ3 may indicate a chronological order of the one or more reset time intervals and one or more signal time intervals. For example, every unit time interval (or during the unit time interval) where the image sensor 100 operates, depending on each of the operation sequences OPSEQ1, OPSEQ2, and OPSEQ3, the one or more reset time intervals and the one or more signal time intervals may arrive (or start) in a preset order.

In an embodiment, each of the control time intervals CTINV1, CTINV2, and CTINV3 may include a portion of a reset time interval included in the corresponding operation sequence or a portion of a signal time interval included therein. For example, the control time interval CTINV1 may include a portion of the reset time interval included in the operation sequence OPSEQ1 and a portion of the signal time interval included therein; like the control time interval CTINV1, the control time interval CTINV2 may include a portion of the reset time interval included in the operation sequence OPSEQ2 and a portion of the signal time interval included therein, and the control time interval CTINV3 may include a portion of the reset time interval included in the operation sequence OPSEQ3 and a portion of the signal time interval included therein.

In an embodiment, a first operation sequence (e.g., OPSEQ1) among one or more operation sequences (e.g., OPSEQ1 to OPSEQ3) may indicate a chronological order of a first reset time interval and a first signal time interval, the operation schedule information OPSI may include a first control time interval (e.g., CTINV1) associated with the first operation sequence, and the first control time interval may include a portion of the first reset time interval or a portion of the first signal time interval.

Figure 3:
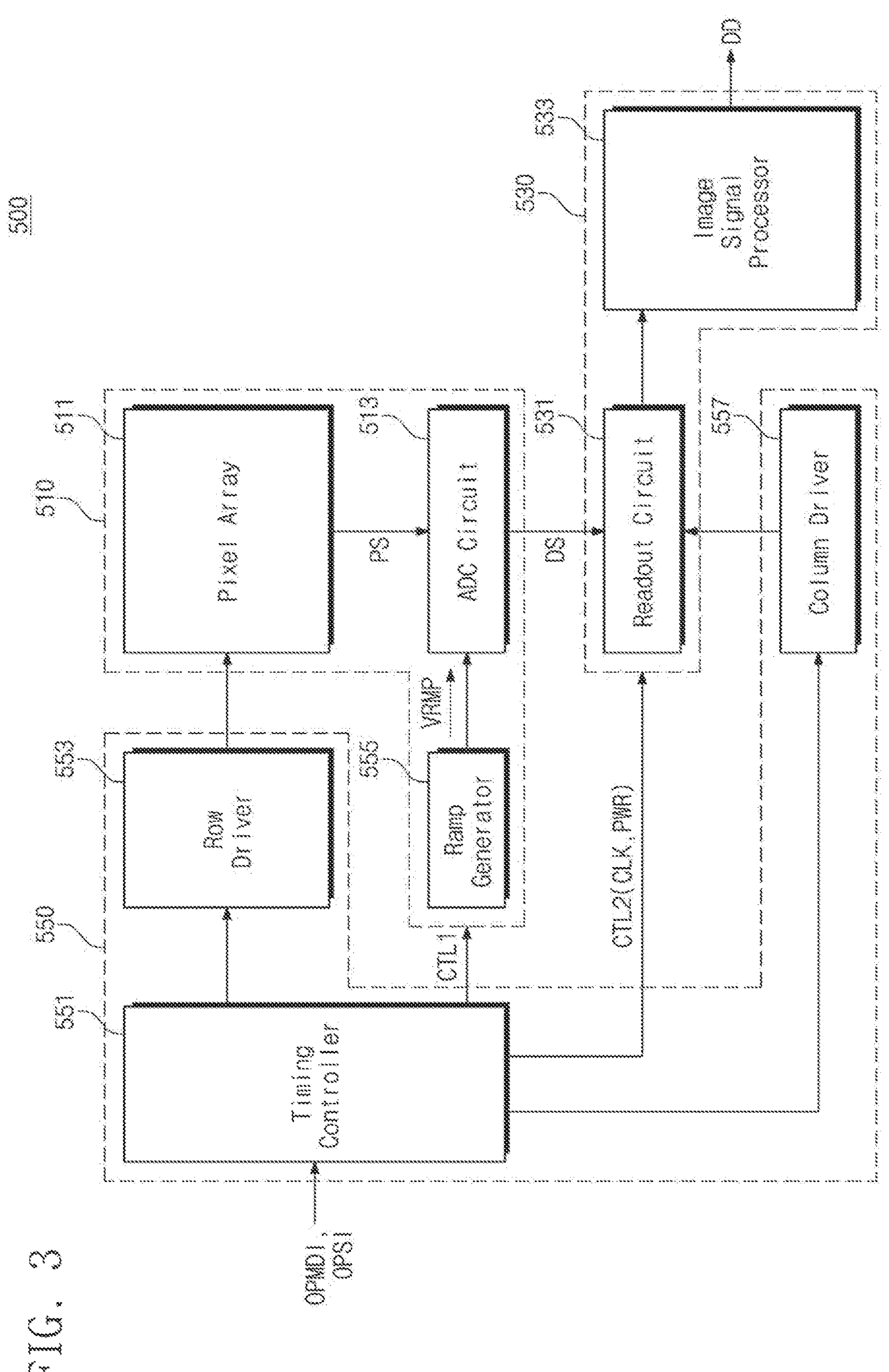
FIG. 3 is a block diagram illustrating an embodiment of an image sensor of FIG. 1.

FIG. 3 is a block diagram illustrating an embodiment of an image sensor of FIG. 1.

Referring to FIG. 3, an image sensor 500 may include a pixel array 511, an analog-to-digital converter circuit 513, a readout circuit 531, an image signal processor 533, a timing controller 551, a row driver 553, a ramp generator 555, and a column driver 557. The image sensor 500 may correspond to the image sensor 100 of FIG. 1.

The pixel array 511 may include a plurality of pixels that are arranged to be spaced from each other in a row direction and to be spaced from each other in a column direction. Each of the plurality of pixels may be connected to one of a plurality of rows and one of a plurality of columns. The pixel array 511 may sense a light incident through a lens, may generate photo charges through photoelectric conversion, and may output pixel signals PS based on the photo charges.

The ramp generator 555 may generate a ramp signal VRAMP whose voltage level changes in a pre-scheduled manner every unit time interval where the image sensor 500 operates.

The analog-to-digital converter circuit 513 may generate digital codes based on a result of comparing the pixel signals PS with the ramp signal VRAMP and may output the digital codes as the digital signals DS.

In an embodiment, the pixel array 511, the analog-to-digital converter circuit 513, and the ramp generator 555 may constitute the analog signal processing circuitry 110 of FIG. 1, the readout circuit 531 and the image signal processor 533 may correspond to the digital data processing circuitry 130 of FIG. 1, and the timing controller 551, the row driver 553, and the column driver 557 may constitute the control circuit 150 of FIG. 1. However, the present disclosure is not limited thereto.

In an embodiment, the timing controller 551 may receive the operation mode information OPMDI and the operation schedule information OPSI from the outside and may control the row driver 553 and the column driver 557 based on the operation mode information OPMDI and the operation schedule information OPSI. In particular, the timing controller 551 may output the control signal CTL1 to control an analog signal processing circuitry 510 and may output the control signal CTL2 to control a digital signal processing circuitry 530.

Figure 4A:
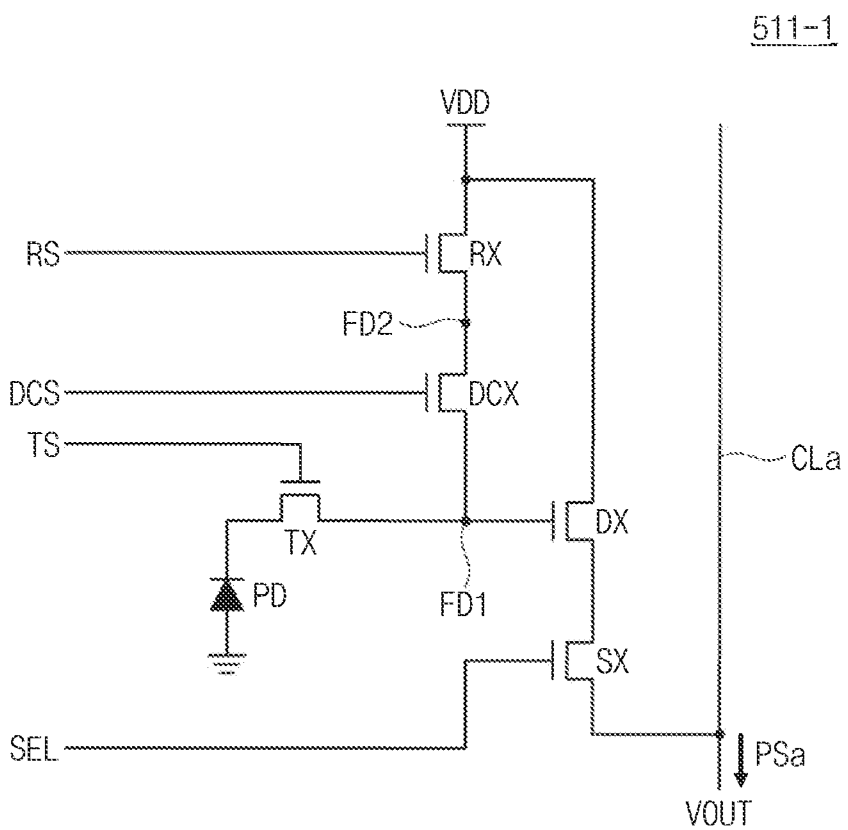
FIG. 4A is a circuit diagram illustrating an embodiment of one pixel included in a pixel array of FIG. 3.
Figure 4B:
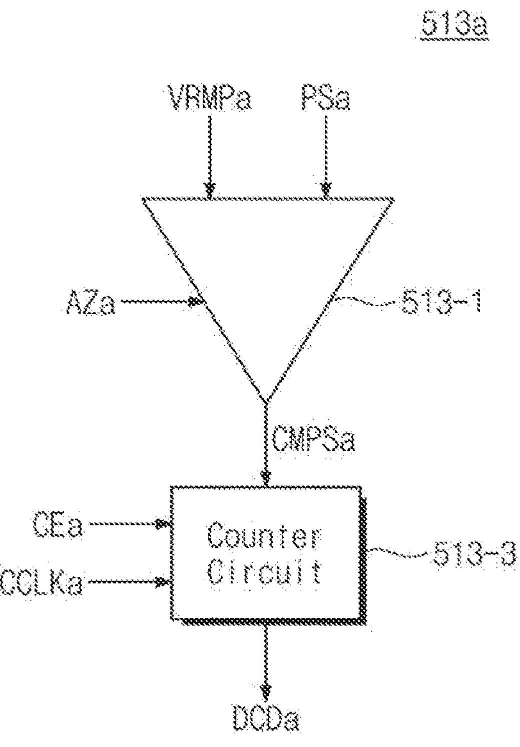
FIG. 4B is a block diagram illustrating an embodiment of one comparison circuit and one counter circuit that are included in an analog-to-digital converter circuit of FIG. 3 and correspond to one pixel.
Figure 4C:
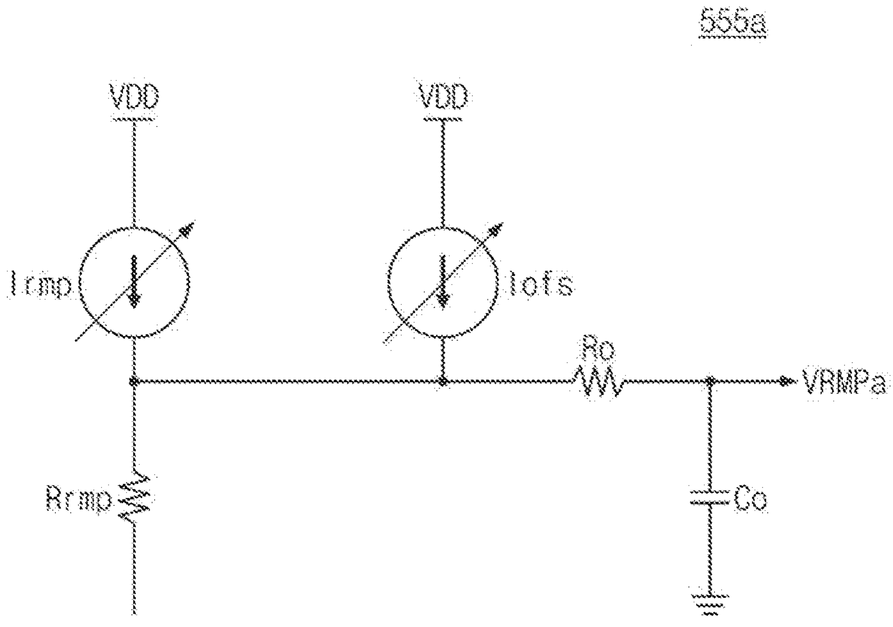
FIG. 4C is a circuit diagram illustrating an embodiment of a ramp generator of FIG. 3.

FIG. 4A is a circuit diagram illustrating an embodiment of one pixel included in a pixel array of FIG. 3. FIG. 4B is a block diagram illustrating an embodiment of one comparison circuit and one counter circuit that are included in an analog-to-digital converter circuit of FIG. 3 and correspond to one pixel. FIG. 4C is a circuit diagram illustrating an embodiment of a ramp generator of FIG. 3.

Referring to FIGS. 3 and 4A, the pixel array 511 may include a plurality of pixels, and one (e.g., 511-1) of the plurality of pixels is illustrated in FIG. 4A.

A pixel 511-1 may include a photoelectric conversion element PD, a transfer transistor TX, a reset transistor RX, a dual conversion transistor DCX, a drive transistor DX, and a select transistor SX. For example, the pixel 511-1 may be a dual conversion gain pixel capable of operating a "dual conversion gain" operation. For example, a magnitude of a conversion gain being a ratio at which the pixel 511-1 converts photo charges accumulated in a floating diffusion region into a pixel signal PSa may be adjusted depending on a change of an illuminance environment. For example, the magnitude of the conversion gain of the pixel 511-1 may decrease in the high-illuminance environment and may increase in the low-illuminance environment.

The reset transistor RX may initialize a voltage level of the floating diffusion region based on a control signal RS. The photoelectric conversion element PD may generate photo charges, the amount of which is proportional to the amount of incident light, and the transfer transistor TX may transfer the photo charges to the floating diffusion region based on a control signal TS.

A magnitude of a capacitance of the floating diffusion region may change depending on whether the dual conversion transistor DCX is turned on or turned off. For example, the dual conversion transistor DCX may be turned on by the control signal DCS in the high-illuminance environment and may be turned off by the control signal DCS in the low-illuminance environment. For example, in the high-illuminance environment, floating diffusion regions FD1 and FD2 may be electrically connected such that the magnitude of the capacitance is increased; in the low-illuminance environment, the floating diffusion regions FD1 and FD2 may be electrically disconnected such that the magnitude of the capacitance is decreased.

The drive transistor DX may amplify a voltage signal corresponding to the amount of photo charges accumulated in the floating diffusion region, the select transistor SX may transfer the voltage signal from the drive transistor DX to a column line CLa based on a control signal SEL such that a voltage signal VOUT is output as the pixel signal PSa.

In an embodiment, as the pixel 511-1 performs the "dual conversion gain" operation, an image sensor may operate in one or more reset time intervals and one or more signal time intervals. For example, in the one or more reset time intervals, the reset transistor RX may be turned on; in the one or more signal time intervals, the drive transistor DX and the select transistor SX may be turned on.

Referring to FIGS. 3 and 4B, the analog-to-digital converter circuit 513 may include one or more analog-to-digital converters, and one (e.g., 513*a*) of the one or more analog-to-digital converters is illustrated in FIG. 4B.

An analog-to-digital converter 513*a* may include a comparison circuit 513-1 and a counter circuit 513-3.

The comparison circuit 513-1 may output a comparison signal CMPSa based on an auto-zero control signal AZa, the pixel signal PSa, and a ramp signal VRAMPa. The counter circuit 513-3 may output a digital code DCDa based on a counter enable signal CEa, a counter clock signal CCLKa, and the comparison signal CMPSa.

In an embodiment, the comparison circuit 513-1 may adjust the voltage level of the pixel signal PSa and the voltage level of the ramp signal VRAMPa based on the auto-zero control signal AZa and may compare the pixel signal PSa and the ramp signal VRAMPa to output the comparison signal CMPSa.

In an embodiment, the counter circuit 513-3 may be driven based on the counter enable signal CEa and the counter clock signal CCLKa and may output the digital code DCDa until a given point in time based on the comparison signal CMPSa.

Referring to FIGS. 3 and 4C, a ramp generator 555*a* may correspond to the ramp generator 555, may include a variable ramp current source Irmp, a variable offset current source Iofs, and a ramp resistor Rrmp, and may further include an output resistor Ro and an output capacitor Co.

The ramp generator 555*a* may generate the ramp signal VRAMPa by adjusting magnitudes (or levels) of currents that are generated by the variable ramp current source Irmp and the variable offset current source Iofs. In an embodiment, the ramp generator 555*a* may adjust a slope of the ramp signal VRAMPa depending on a change of the conversion gain. For example, when the conversion gain changes from a low conversion gain corresponding to the high-illuminance environment to a high conversion gain corresponding to the low-illuminance environment, the ramp generator 555*a* may switch a sign of the slope of the ramp signal VRAMPa from "negative (−)" to "positive (+)" or from "positive (+)" to "negative (−)". For example, when the conversion gain changes from the low conversion gain to the high conversion gain, the ramp generator 555*a* may increase or decrease the slope of the ramp signal VRAMPa.

Figure 5:
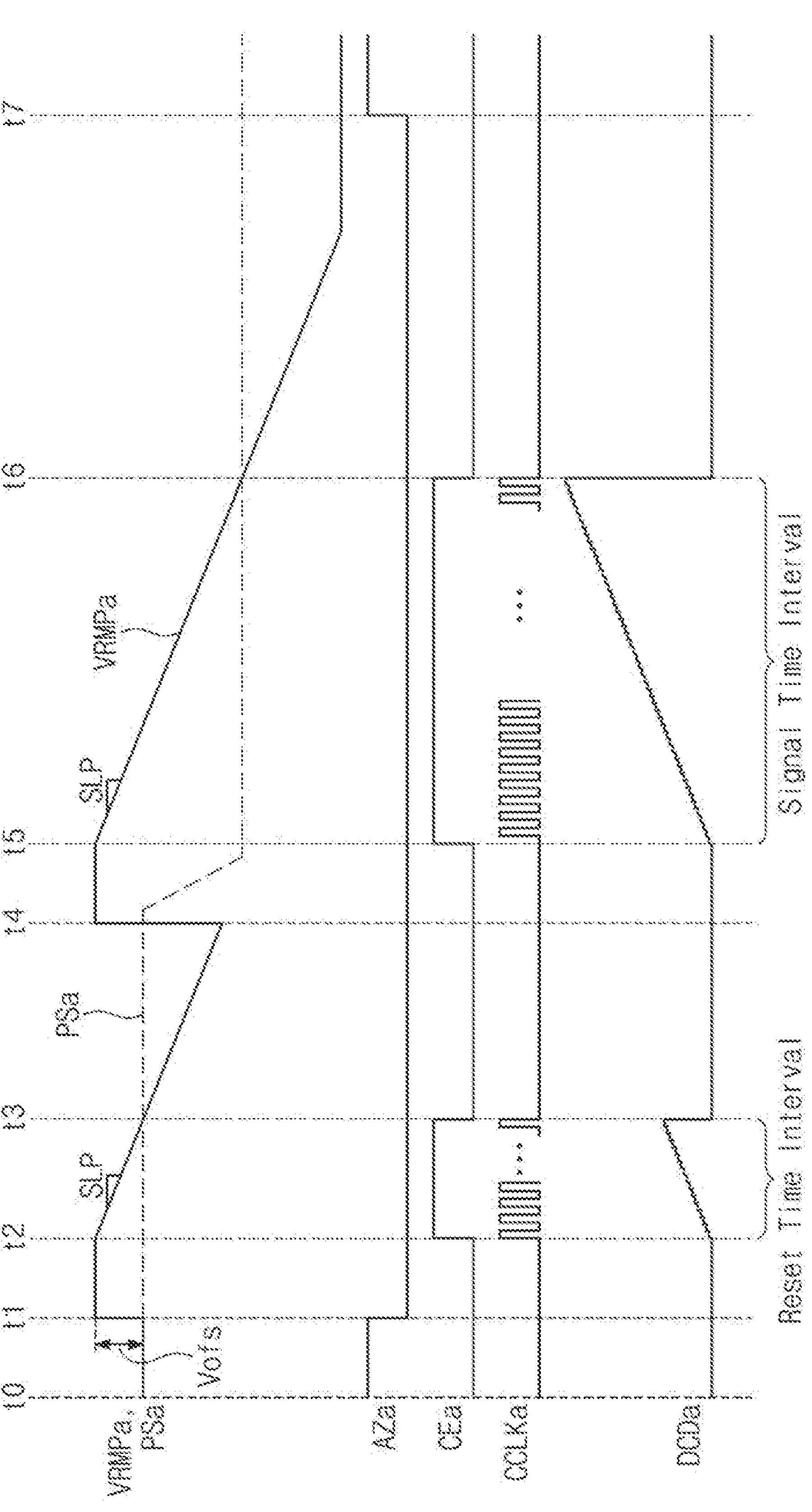
FIG. 5 is a timing diagram for describing an operation of an image sensor of FIG. 3.

FIG. 5 is a timing diagram for describing an operation of an image sensor of FIG. 3.

Referring to FIGS. 3, 4A, 4B, 4C, and 5, the image sensor 500 may output the digital code DCDa over time, based on the control signals AZa, CEa, and CCLKa, the ramp signal VRAMPa, and the pixel signal PSa. For example, the time interval from t0 to t7 may be a "1H time interval" in which the image sensor 500 processes pixel signals generated from pixels corresponding to one row of the pixel array 511. For example, the "1H time interval" may be the unit time interval described with reference to FIG. 1.

In an embodiment, the image sensor 500 may operate in a plurality of time intervals. For example, during the time interval from t0 to t1, the voltage level of the pixel signal PSa and the voltage level of the ramp signal VRAMPa may be adjusted to be substantially identical to each other, based on the auto-zero control signal AZa. During the time interval from t1 to t2, the voltage level of the ramp signal VRAMPa may be adjusted to increase as much as a preset magnitude (e.g., Vofs). During the time interval from t2 to t4 and the time interval from t5 to t7, the voltage level of the ramp signal VRAMPa may be adjusted to change with a preset slope (e.g., SLP). The pixel signal PSa may indicate a reset level during the time interval from t0 to t4 and may indicate a signal level corresponding to the amount of photo charges accumulated in a pixel array during the time interval from t4 to t7.

In an embodiment, the time interval from t0 to t1 may be referred to as an "auto-zero interval", the time interval from t1 to t2 and the time interval from t4 to t5 may be referred to an "offset interval", and the time interval from t2 to t4 and the time interval from t5 to t7 may be referred to as an "A/D conversion interval".

In an embodiment, in the A/D conversion interval, the image sensor 500 may generate the digital code DCDa including a plurality of bits. For example, the image sensor 500 may output the digital code DCDa corresponding to a time interval from a point in time when the counter enable signal CEa and the counter clock signal CCLKa are enabled to a point in time when the voltage level of the pixel signal PSa is substantially identical to the voltage level of the pixel signal PSa. In this case, in the A/D conversion interval, a time interval (e.g., from t2 to t3) in which the pixel signal PSa indicates the reset level may be referred to as a "reset time interval", and a time interval (e.g., from t5 to t6) in which the pixel signal PSa indicates the signal level may be referred to as a "signal time interval".

Figure 6A:
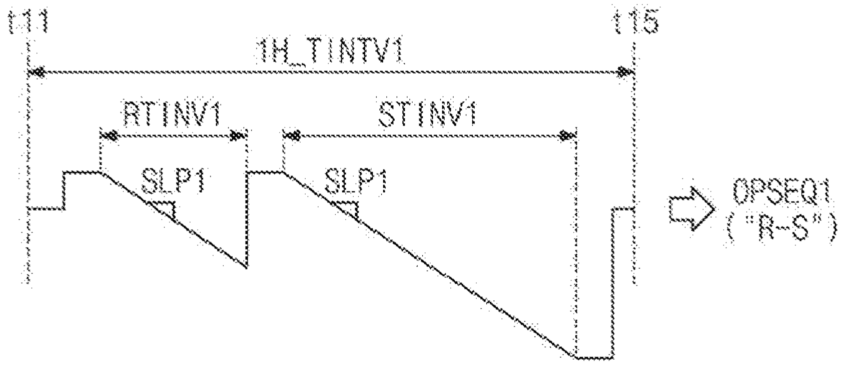
Figure 6B:
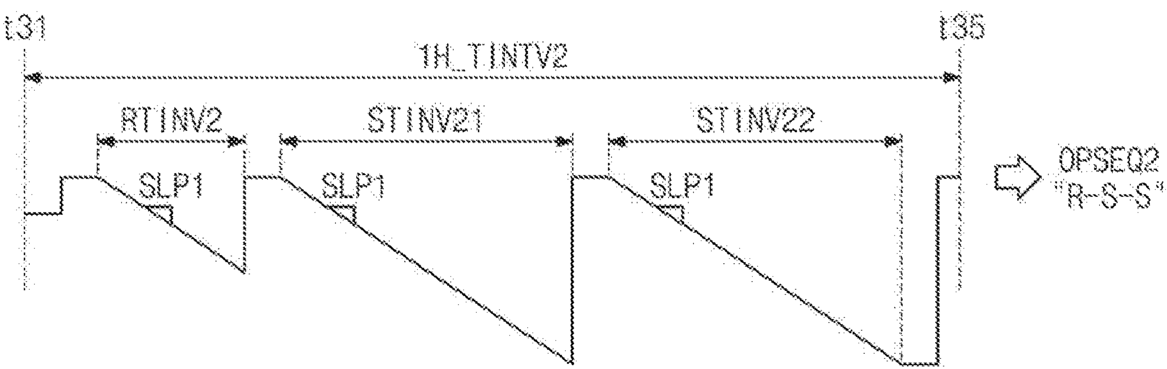
Figure 6C:
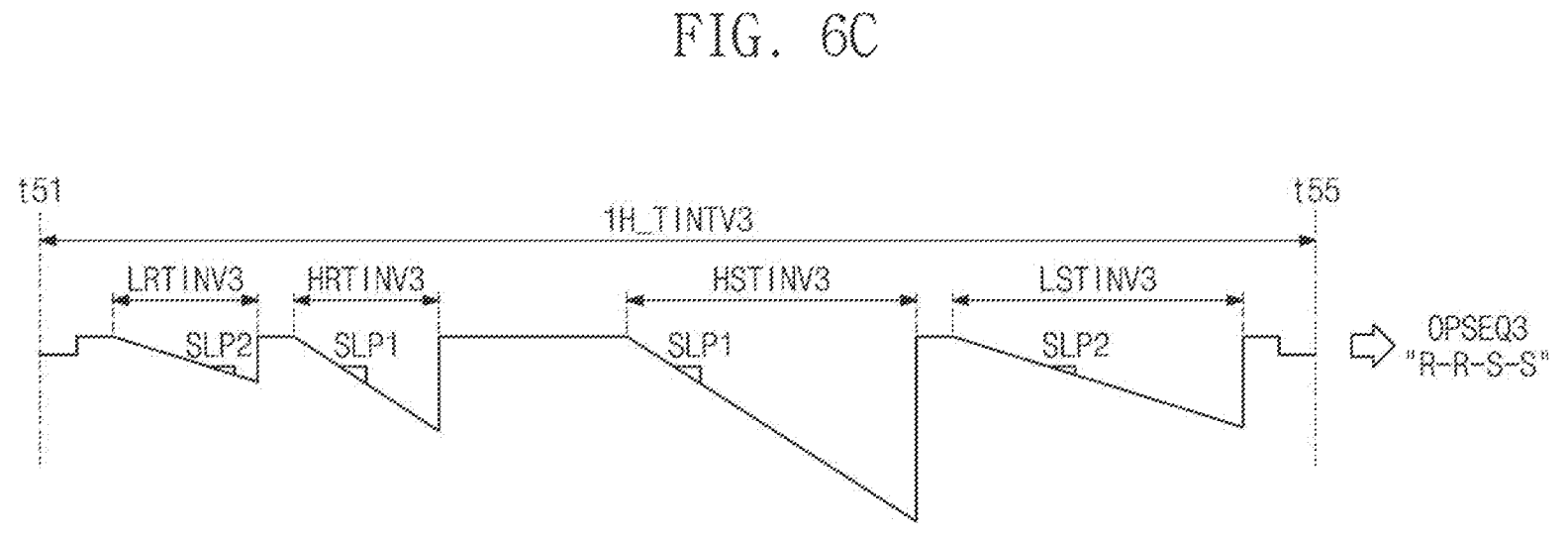

FIGS. 6A, 6B, and 6C are timing diagrams for describing one or more operation sequences of an image sensor of FIG. 3.

In FIGS. 6A, 6B, and 6C, "1H time intervals" 1H_TINV1, 1H_TINV2, and 1H_TINV3 in which the image sensor 500 processes pixel signals generated from pixels corresponding to one row of the pixel array 511 are illustrated, and a ramp signal generated by the ramp generator 555 is illustrated in each of the 1H time intervals 1H_TINV1, 1H_TINV2, and 1H_TINV3.

Referring to FIG. 6A, during the 1H time interval 1H_TINV1 (e.g., from t11 to t15), the image sensor 500 may operate in one reset time interval RTINV1 and one signal time interval STINV1. For example, the image sensor 500 may operate in the reset time interval RTINV1 and in the signal time interval STINV1 after the reset time interval RTINV1; in this case, the operation sequence OPSEQ1 indicating (or defining) an operation of the image sensor 500 may be expressed by a "reset time interval-signal time interval (R-S)". In this case, a ramp signal in the reset time interval RTINV1 and a ramp signal in the signal time interval STINV1 may have the same slope (e.g., SLP1), but the present disclosure is not limited thereto.

Referring to FIG. 6B, during the 1H time interval 1H_TINV2 (e.g., from t31 to t35), the image sensor 500 may operate in one reset time interval RTINV2 and two signal time intervals STINV21 and STINV22. For example, the image sensor 500 may operate in the reset time interval RTINV2, in the signal time interval STINV21 after the reset time interval RTINV2, and in the signal time interval STINV22 after the signal time interval STINV21; in this case, the operation sequence OPSEQ2 indicating an operation of the image sensor 500 may be expressed by a "reset time interval-signal time interval-signal time interval (R-S-S)". In this case, a ramp signal in the reset time interval RTINV2, a ramp signal in the signal time interval STINV21, and a ramp signal in the signal time interval STINV22 may have the same slope (e.g., SLP1), but the present disclosure is not limited thereto.

Referring to FIG. 6C, during the 1H time interval 1H_TINV3 (e.g., from t51 to t55), the image sensor 500 may operate in two reset time intervals LRTINV3 and HRTINV3 and two signal time intervals HSTINV3 and LSTINV3. For example, the image sensor 500 may operate in the reset time interval LRTINV3, in the reset time interval HRTINV3 after the reset time interval LRTINV3, in the signal time interval HSTINV3 after the reset time interval HRTINV3, and in the signal time interval LSTINV3 after the signal time interval HSTINV3; in this case, the operation sequence OPSEQ3 indicating an operation of the image sensor 500 may be expressed by a "reset time interval-reset time interval-signal time interval-signal time interval (R-R-S-S)". In the operation sequence OPSEQ3, a ramp signal in the reset time interval LRTINV3 and a ramp signal in the signal time interval LSTINV3 may have the same slope (e.g., SLP2), a ramp signal in the reset time interval HRTINV3 and a ramp signal in the signal time interval HSTINV3 may have the same slope (e.g., SLP1), and the slope SLP2 and the slope SLP1 may have the same sign but may be different in value. However, the present disclosure is not limited thereto.

Referring to FIGS. 2 and 6A to 6C, the operation schedule information OPSI may include one or more operation sequences (e.g., OPSEQ1 to OPSEQ3), and a first operation sequence among the one or more operation sequences may indicate a chronological order of a first reset time interval and a first signal time interval.

FIGS. 7A, 7B, 7C, 7D, and 7E are diagrams for describing one or more control time intervals associated with one or more operation sequences of an image sensor of FIG. 3.

Referring to FIGS. 2, 7A, 7B, 7C, 7D, and 7E, each of the one or more operation sequences may include a control time interval, and the control time interval may include a portion of a reset time interval or a portion of a signal time interval. In FIGS. 7A to 7E, the "1H time interval 1H_TINV" is illustrated, and one reset time interval RTINVa and one signal time interval STINVa capable of being set by an operation sequence (e.g., OPSEQ) are illustrated. The control time interval may be divided into one or more sections on a time axis, and each of the sections thus divided may be referred to as a "control section".

In an embodiment, the reset time interval RTINVa may be one of the reset time intervals RTINV1, RTINV2, LRTINV3, and HRTINV3 described with reference to FIG. 6A to 6C, and the signal time interval STINVa may be one of the signal time intervals STINV1, STINV21, STINV22, HSTINV3, and LSTINV3 described with reference to FIGS. 6A to 6C.

Figures 7A, 7B:
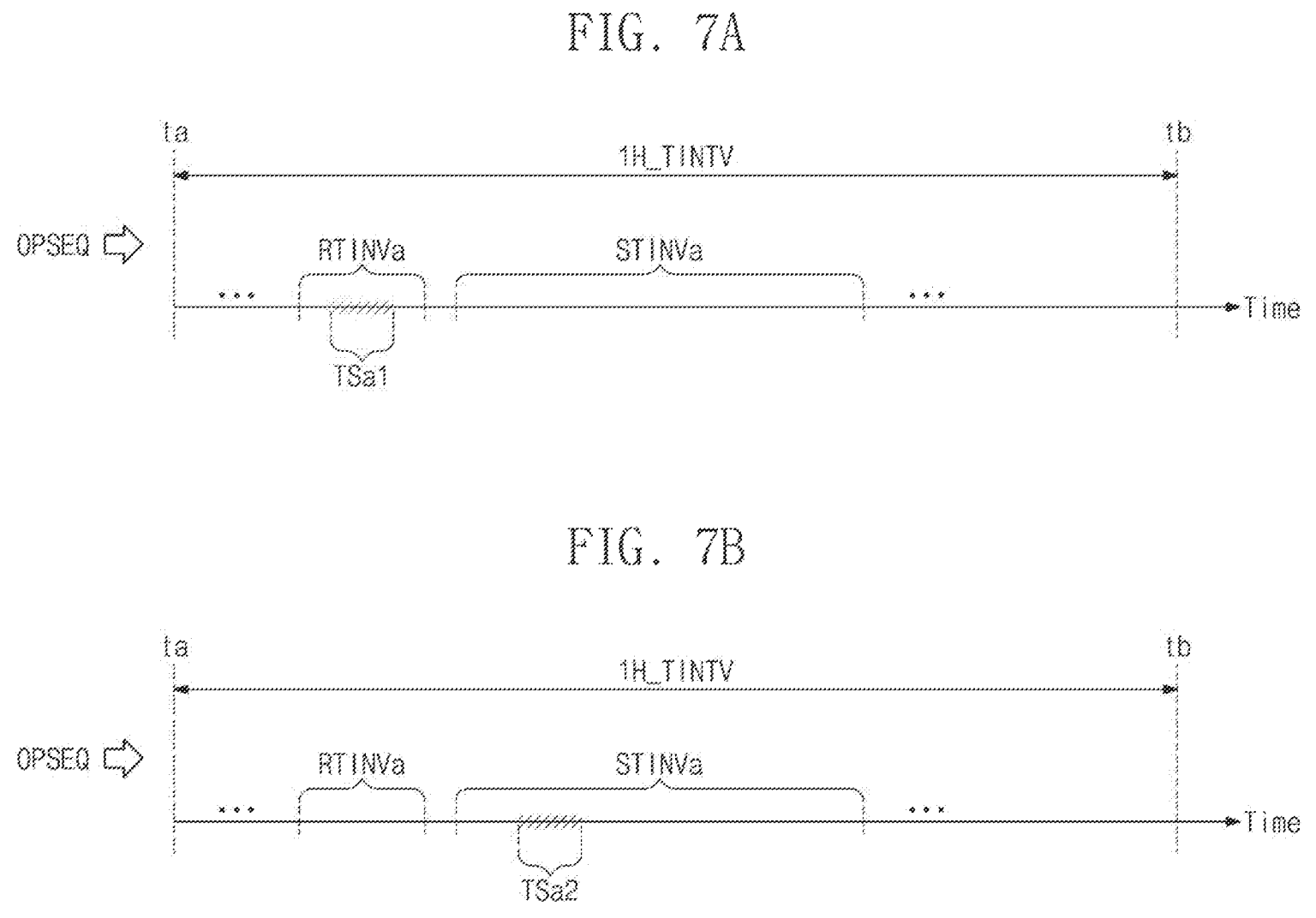

Referring to FIG. 7A, a control time interval TSa1 may be set to include a portion of the reset time interval RTINVa. For example, the control time interval TSa1 may be set to be included in the reset time interval RTINVa and not to be included in the signal time interval STINVa.

Referring to FIG. 7B, a control time interval TSa2 may be set to include a portion of the signal time interval STINVa. For example, the control time interval TSa2 may be set to be included in the signal time interval STINVa and not to be included in the reset time interval RTINVa.

Figures 7C, 7D:
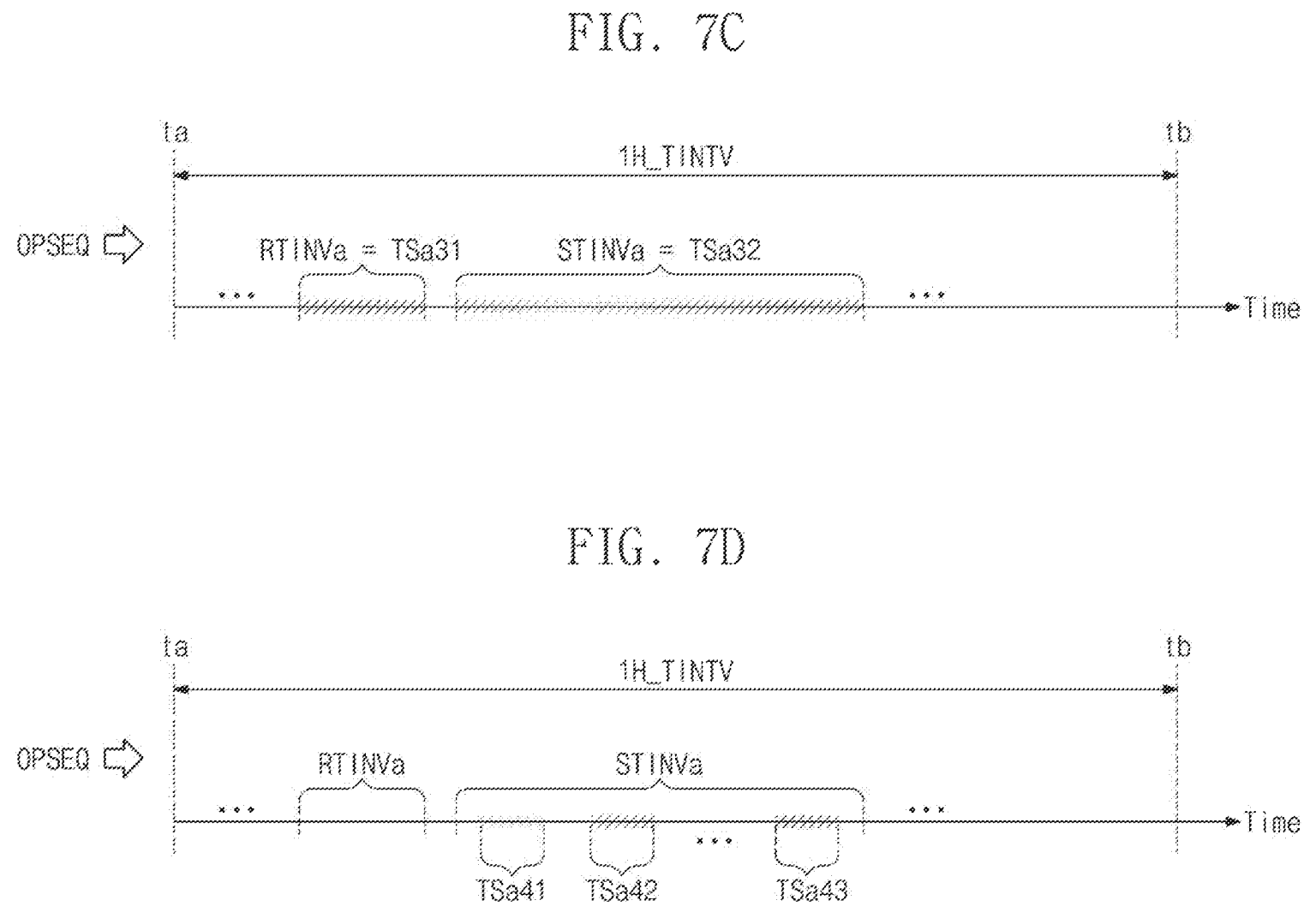

Referring to FIG. 7C, a control time interval TSa31 may be set to include the entire reset time interval RTINVa, and a control time interval TSa32 may be set to include the entire signal time interval STINVa. For example, the control time interval TSa31 may be set to be substantially the same as the reset time interval RTINVa and the control time interval TSa32 may be set to be substantially the same as the signal time interval STINVa.

Referring to FIG. 7D, each of control time intervals TSa41, TSa42, and TSa43 may be set to include a portion of the signal time interval STINVa. For example, each of the control time intervals TSa41, TSa42, and TSa43 may be set to be included in the signal time interval STINVa and not to be included in the reset time interval RTINVa.

Figure 7E:
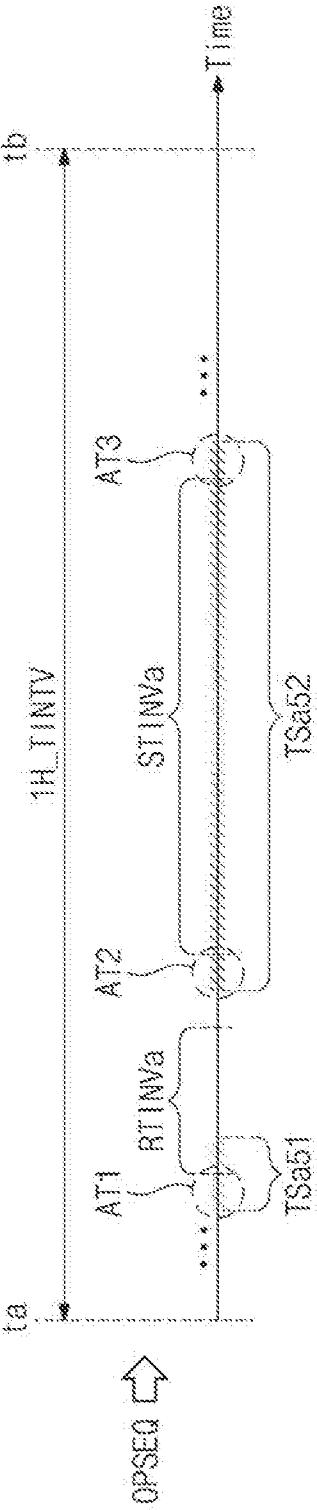

Referring to FIG. 7E, a control time interval TSa51 may be set to include a portion of the reset time interval RTINVa, and a control time interval TSa52 may be set to include the entire signal time interval STINVa. For example, a portion of the control time interval TSa51 may be set to be included in the reset time interval RTINVa, and a portion of the control time interval TSa52 may be set to be included in the signal time interval STINVa. For example, the control time interval TSa51 may further include a time interval (e.g., AT1) immediately before the reset time interval RTINVa, and the control time interval TSa52 may further include a time interval (e.g., AT2) immediately before the signal time interval STINVa and a time interval (e.g., AT3) immediately after the signal time interval STINVa. The time intervals AT1, AT2, and AT3 may be set to prevent a transient change of power consumption in a digital data processing circuitry.

Referring to FIGS. 2, 6A to 6C, and 7A to 7E, the operation schedule information OPSI may include one or more operation sequences (e.g., OPSEQ1 to OPSEQ3), and a first operation sequence among the one or more operation sequences may indicate a chronological order of a first reset time interval and a first signal time interval.

In an embodiment, the operation schedule information OPSI may include a first control time interval associated with the first operation sequence, and the first control time interval may include a portion of the first reset time interval or a portion of the first signal time interval.

In an embodiment, the first control time interval may include the entire first reset time interval or the entire first signal time interval.

In an embodiment, the first control time interval may include a time interval immediately before the first reset time interval or a time interval immediately after the first reset time interval and may include a time interval immediately before the first signal time interval or a time interval immediately after the first signal time interval.

Figure 8:
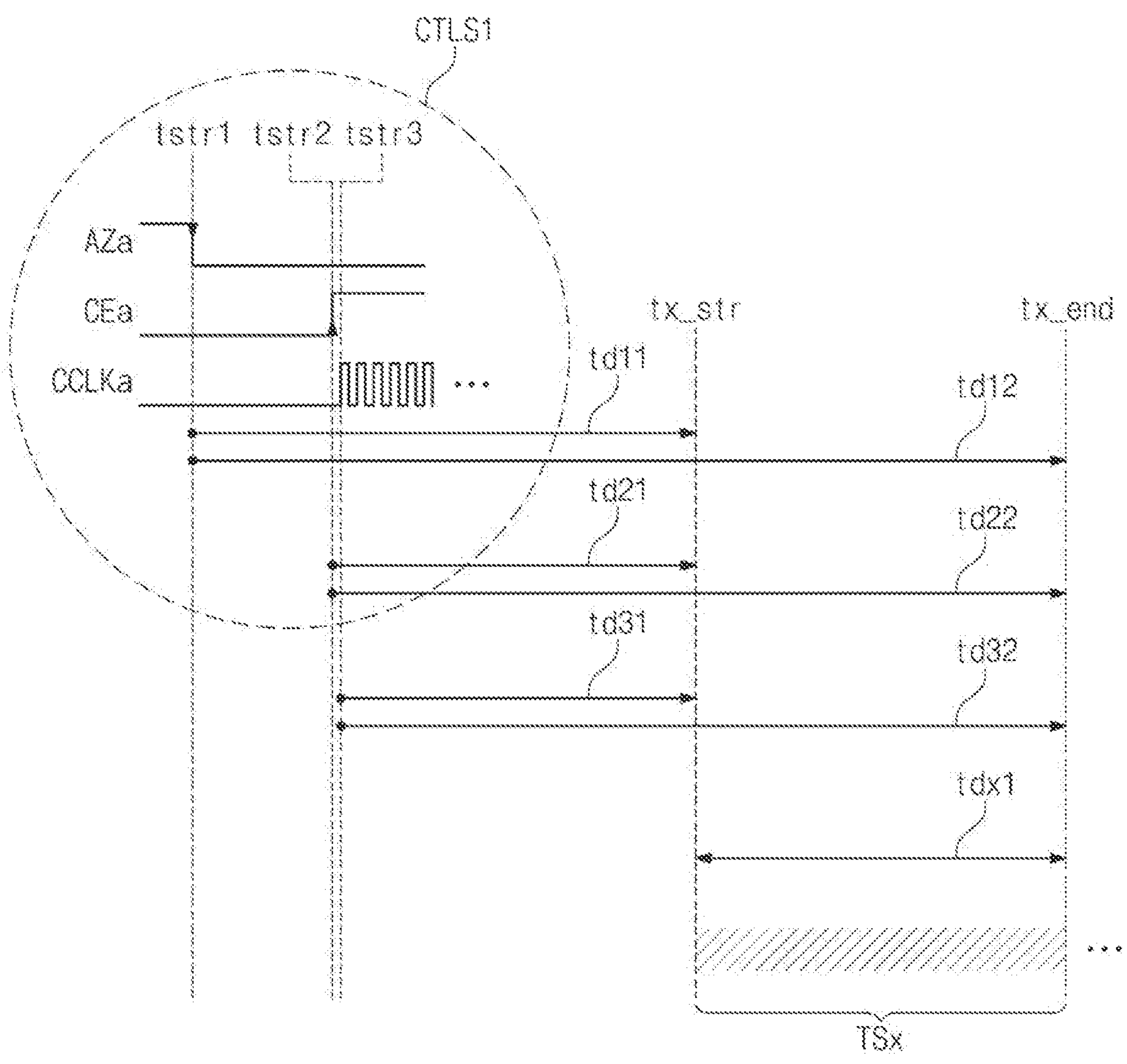
FIGS. 8, 9, and 10 are diagrams for describing how to define one or more control time intervals of FIGS. 7A to 7E.
Figure 9:
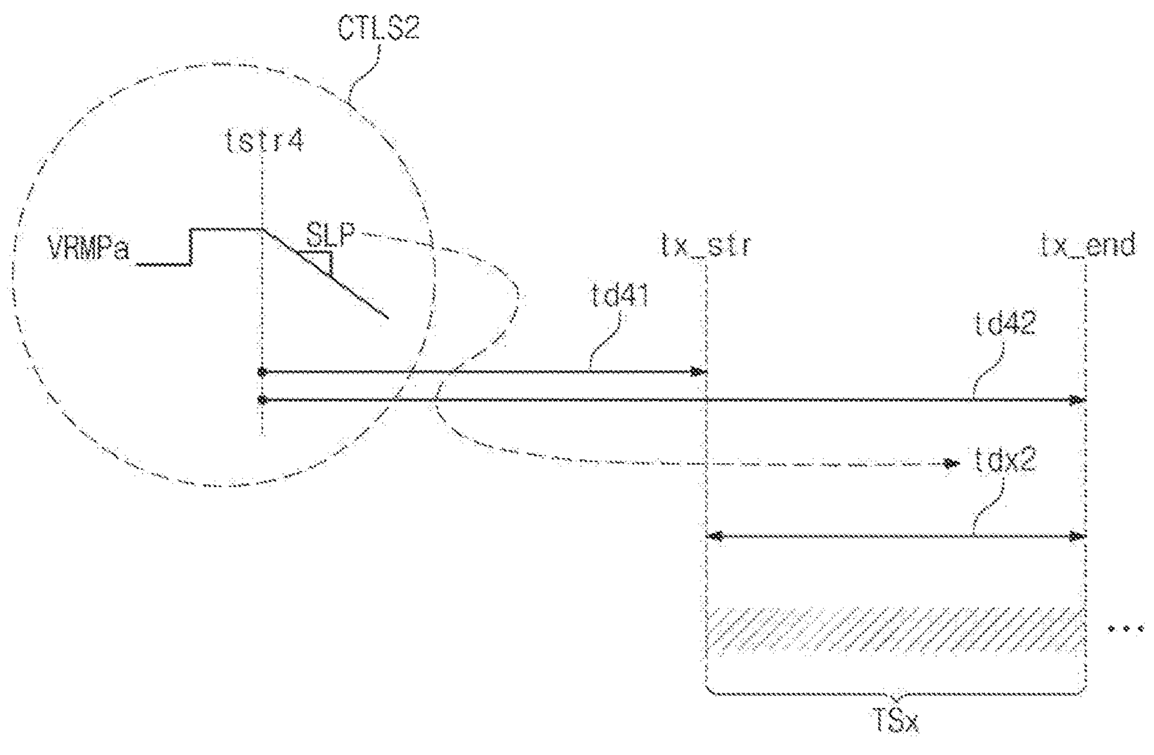
Figure 10:
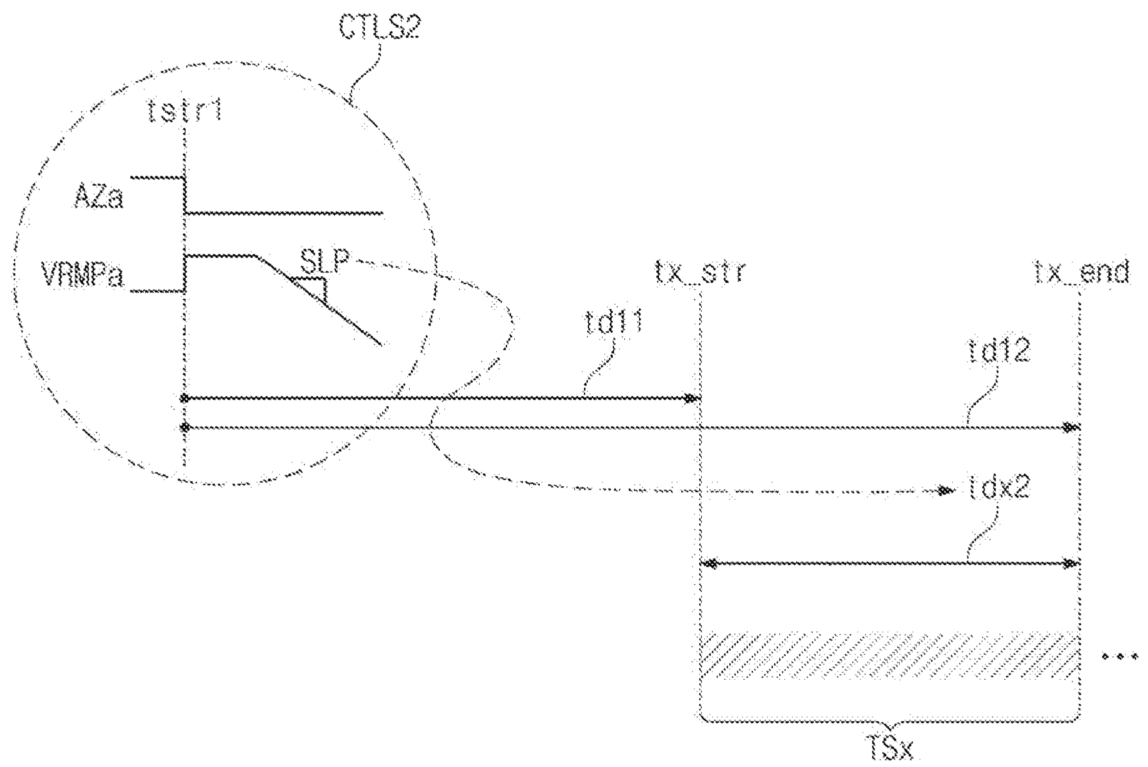

FIGS. 8, 9, and 10 are diagrams for describing how to define one or more control time intervals of FIGS. 7A to 7E.

In FIGS. 8, 9, and 10, a control time interval TSx is illustrated. The control time interval TSx may be one of the control time intervals TSa1, TSa2, TSa31, TSa32, TSa41, TSa42, TSa43, TSa51, and TSa52 described with reference to FIGS. 7A to 7E.

Referring to FIG. 8, the control time interval TSx may be set based on one or more of the auto-zero control signal AZa, the counter enable signal CEa, and the counter clock signal CCLKa described with reference to FIG. 4B.

In an embodiment, the control time interval TSx may be set based on one or more of a point in time tstr1 when the auto-zero control signal AZa is disabled, a point in time tstr2 when the counter enable signal CEa is enabled, and a point in time tstr3 when the counter clock signal CCLKa is applied. For example, the control time interval TSx may range from a point in time tx_str to a point in time tx_end. When the control time interval TSx is set based on the auto-zero control signal AZa, the control time interval TSx may be set by using a temporal distance (e.g., td11) from the point in time tstr1 to the point in time tx_str and a temporal distance (e.g., td12) from the point in time tstr1 to the point in time tx_end. When the control time interval TSx is set based on the counter enable signal CEa, the control time interval TSx may be set by using a temporal distance (e.g., td21) from the point in time tstr2 to the point in time tx_str and a temporal distance (e.g., td22) from the point in time tstr2 to the point in time tx_end. When the control time interval TSx is set based on the counter clock signal CCLKa, the control time interval TSx may be set by using a temporal distance (e.g., td31) from the point in time tstr3 to the point in time tx_str and a temporal distance (e.g., td32) from the point in time tstr3 to the point in time tx_end.

In an embodiment, the operation schedule information OPSI may include a first control time interval (e.g., TSx) associated with the first operation sequence, and the first control time interval may be set based on temporal distances (e.g., td11, td12, td21, td22, td31, and td32) from one or more of a first point in time (e.g., tstr1), a second point in time (e.g., tstr2), and a third point in time (e.g., tstr3).

Referring to FIG. 9, the control time interval TSx may be set based on the ramp signal VRAMPa described with reference to FIG. 4C (CTLS2).

In an embodiment, the control time interval TSx may be set based on a point in time tstr4 at which the slope of the ramp signal VRAMPa changes. For example, the control time interval TSx may range from the point in time tx_str to the point in time tx_end. When the control time interval TSx is set based on the ramp signal VRAMPa, the control time interval TSx may be set by using a temporal distance (e.g., td41) from the point in time tstr4 to the point in time tx_str and a temporal distance (e.g., td42) from the point in time tstr4 to the point in time tx_end. For example, the control time interval TSx may have a time interval tdx2 from tx_str to tx_end, and the control time interval TSx may be set by using the temporal distance td41 and the temporal distance tdx2.

In an embodiment, the time interval tdx2 that the control time interval TSx has may be adjusted based on a length of each of the reset time interval or the signal time interval described with reference to FIGS. 3 and 5. For example, the time interval tdx2 that the control time interval TSx has may be set to be inversely proportional to an absolute value of the slope SLP of the ramp signal VRAMPa. For example, as the absolute value of the slope SLP of the ramp signal VRAMPa becomes greater, the time interval tdx2 may become shorter; as the absolute value of the slope SLP of the ramp signal VRAMPa becomes smaller, the time interval tdx2 may become longer.

In an embodiment, the operation schedule information OPSI may include a first control time interval (e.g., TSx) associated with the first operation sequence, and the first control time interval may be set based on a fourth point in time (e.g., tstr4). In this case, a length of the first control time interval may be inversely proportional to an absolute value of a slope of a ramp signal.

Referring to FIG. 10, the control time interval TSx may be set based on one of the ramp signal VRAMPa and one of the auto-zero control signal AZa, the counter enable signal CEa, and the counter clock signal CCLKa (CTLS3).

In an embodiment, the control time interval TSx may be set based on the point in time tstr1 at which the auto-zero control signal AZa is disabled. For example, the control time interval TSx may be set by using a temporal distance (e.g., td11) from the point in time tstr1 to the point in time tx_str and a temporal distance (e.g., td12) from the point in time tstr1 to the point in time tx_end.

In an embodiment, the time interval tdx2 that the control time interval TSx has may be set to be inversely proportional to the absolute value of the slope SLP of the ramp signal VRAMPa. For example, as the absolute value of the slope SLP of the ramp signal VRAMPa becomes greater, the time interval tdx2 may become shorter; as the absolute value of the slope SLP of the ramp signal VRAMPa becomes smaller, the time interval tdx2 may become longer.

Among the embodiments described with reference to FIGS. 8 and 9, the embodiment in which the control time interval TSx is set by a combination that is based on the auto-zero control signal AZa and the ramp signal VRAMPa is described with reference to FIG. 10; however, alternative embodiments in which the control time interval TSx is set by a combination that is based on the ramp signal VRAMPa and one of the counter enable signal CEa and the counter clock signal CCLKa may also suffice.

Figure 11B:
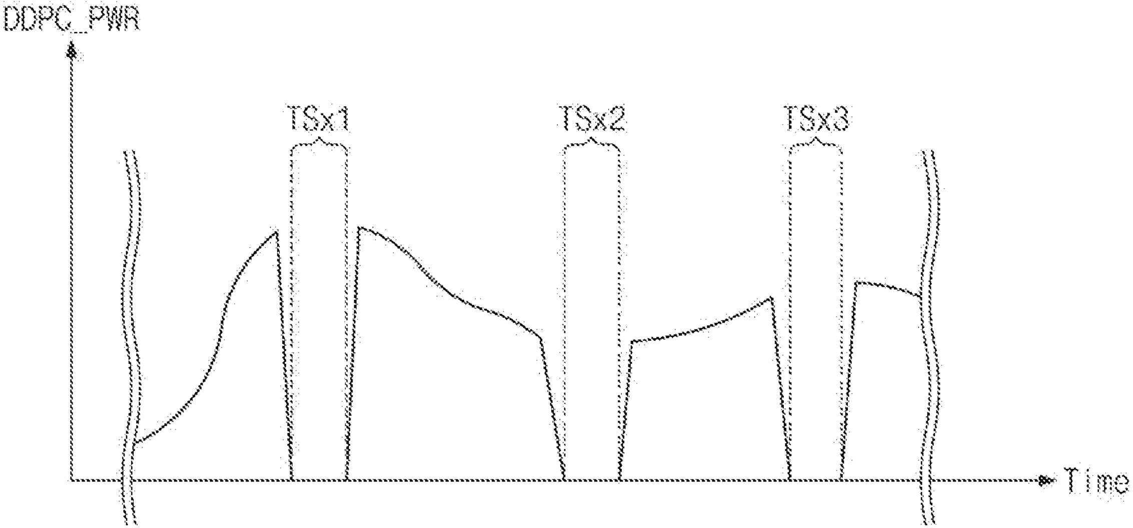
FIG. 11B is a diagram for describing power consumption of a digital data processing circuitry.

FIG. 11A is a diagram for describing operations of one or more digital circuits included in a digital data processing circuitry of FIG. 1. FIG. 11B is a diagram for describing power consumption of a digital data processing circuitry.

An image sensor 600 is illustrated in FIG. 11A. The image sensor 600 may include a digital data processing circuitry 630 and a control circuit 650. The image sensor 600 may correspond to the image sensor 100 of FIG. 1, the digital data processing circuitry 630 and the control circuit 650 may respectively correspond to the digital data processing circuitry 130 and the control circuit 150 of FIG. 1. The image sensor 600 may correspond to the image sensor 500 of FIG. 3, the digital data processing circuitry 630 and the control circuit 650 may respectively correspond to the digital data processing circuitry 530 and the control circuit 550 of FIG. 3.

Referring to FIG. 11A, the digital data processing circuitry 630 may include one or more digital circuits 631-11, 631-12, 631-13, 631-21, 631-22, and 631-23. The one or more digital circuits 631-11, 631-12, 631-13, 631-21, 631-22, and 631-23 may generate digital data by processing the digital signals received from an analog signal processing circuitry (e.g., 110 of FIG. 1 or 510 of FIG. 3). For example, the one or more digital circuits 631-11, 631-12, 631-13, 631-21, 631-22, and 631-23 may temporarily store the digital signals and may generate the digital signals by performing image signal processing for enhancement of the quality of image with respect to the digital signals.

The control circuit 650 may provide the control signal CTL2 to the digital data processing circuitry 630. The control signal CTL2 may include one or more clock signals CLK11, CLK12, CLK13, CLK21, CLK22, and CLK23 and one or more power signals PWR11, PWR12, PWR13, PWR21, PWR22, and PWR23, and the one or more clock signals CLK11 to CLK13 and CLK21 to CLK23 and the one or more power signals PWR11 to PWR13 and PWR21 to PWR23 may be provided to the one or more digital circuits 631-11 to 631-13 and 631-21 to 631-23 as illustrated in FIG. 11A. However, the present disclosure is not limited thereto.

In an embodiment, the image sensor 600 may perform pre-scheduled operations every unit time interval described with reference to FIG. 2. For example, the image sensor 600 may operate in one or more reset time intervals and one or more signal time intervals included in the unit time interval.

In an embodiment, each of operation sequences may indicate a chronological order of the one or more reset time intervals and one or more signal time intervals. Each of one or more control time intervals may include a portion of a reset time interval included in the corresponding operation sequence or a portion of a signal time interval included therein. Each of the one or more control time intervals may include the entire reset time interval or the entire signal time interval. Each of the one or more control time intervals may include a time interval immediately before the reset time interval or a time interval immediately after the reset time interval and may include a time interval immediately before the signal time interval or a time interval immediately after the signal time interval. For example, each of the one or more control time intervals may be one of the control time intervals described with reference to FIGS. 1, 2, and 7A to 7E.

In an embodiment, in each of the one or more control time intervals, the control circuit 650 may block some or all of the one or more clock signals CLK11 to CLK13 and CLK21 to CLK23 or some or all of the one or more power signals PWR11 to PWR13 and PWR21 to PWR23 based on the control signal CTL2.

In an embodiment, the one or more digital circuits 631-11 to 631-13 and 631-21 to 631-23 may be classified into a first digital circuit block (e.g., TDC) and a second digital circuit block (e.g., nTDC) based on a statistical analysis associated with a noise characteristic of the analog signal processing circuitry by operations of the one or more digital circuits 631-11 to 631-13 and 631-21 to 631-23 or spatial distances from the analog signal processing circuitry. For example, when operations of specific circuits, which affect operations of the analog signal processing circuitry, from among the one or more digital circuits 631-11 to 631-13 and 631-21 to 631-23 have a negative influence on the noise characteristic as much as a given level or higher, the specific circuits having the negative influence on the noise characteristic as much as the given level or higher may be classified as the first digital circuit block. For example, when specific circuits from among the one or more digital circuits 631-11 to 631-13 and 631-21 to 631-23 are disposed inside a semiconductor chip with the analog signal processing circuitry within a given distance or less, the specific circuits disposed with the analog signal processing circuitry within the given distance or less may be classified as the first digital circuit block. In this case, in each of the one or more control time intervals, the control circuit 650 may block clock signals or power signals provided only to the first digital circuit block, and clock signals or power signals provided to the second digital circuit block may not be blocked.

In an embodiment, when the operation sequence of the image sensor 600 is changed by a change of the operation mode of the image sensor 600, the control circuit 650 may control operations of the one or more digital circuits 631-11 to 631-13 and 631-21 to 631-23 based on a control time interval associated with the changed operation sequence.

For example, the change of the operation mode of the image sensor 600 may be performed based on new operation mode information OPMDI received from the external application processor (e.g., 300) described with reference to FIG. 1. Referring to the operation schedule information OPSI of FIG. 2, when the change of the operation mode (e.g., from OPM1 to OPM2) causes a change of the operation sequence (e.g., from OPSEQ1 to OPSEQ2), and the change of the operation sequence may cause a change of a control time interval (e.g., from CTINV1 to CTINV2). Accordingly, when the change of the control time interval is made by the change of the operation mode, a time interval in which operations of the one or more digital circuits 631-11 to 631-13 and 631-21 to 631-23 are controlled may also be changed, and detailed operations associated with the control of the operations of the one or more digital circuits 631-11 to 631-13 and 631-21 to 631-23 may be performed by the configurations or operations described with reference to FIGS. 6A to 6C, 7A to 7E, and 8 to 10.

Referring to FIGS. 11A and 11B, power consumption DDPC_PWR of the digital data processing circuitry 630 may change over time. Time intervals TSx1, TSx2, and TSx3 may correspond to the one or more control time intervals; as clock signals or power signals provided to the first digital circuit block are blocked in the time intervals TSx1, TSx2, and TSx3, the power consumption DDPC_PWR may decrease, and the noise characteristic of the analog signal processing circuitry may be improved.

FIGS. 12A and 12B are diagrams illustrating embodiments of operation schedule information of FIG. 1.

Operation schedule information OPSIa and OPSIb different from the operation schedule information OPSI illustrated in FIG. 2 are illustrated in FIGS. 12A and 12B.

Referring to FIGS. 11A and 12A, the operation schedule information OPSIa may include an operation mode, an operation sequence, and a control time interval.

In an embodiment, the operation mode may include operation modes OPM1, OPM2, OPM3, OPM4, and OPM5, the operation sequence may include operation sequences OPSEQ1 and OPSEQ2, and the control time interval may include control time intervals CTINV1 and CTINV2. In FIG. 12A, the operation sequence OPSEQ1 may correspond to the operation modes OPM1 and OPM2, the operation sequence OPSEQ2 may correspond to the operation modes OPM3 to OPM5, and the control time intervals CTINV1 and CTINV2 may respectively correspond to the operation sequences OPSEQ1 and OPSEQ2.

In an embodiment, when an operation sequence of the image sensor 600 is changed by a change of an operation mode of the image sensor 600, the control circuit 650 may control operations of the one or more digital circuits 631-11 to 631-13 and 631-21 to 631-23 based on a control time interval associated with the changed operation sequence.

For example, even though the operation mode of the image sensor 600 is changed (e.g., from OPM1 to OPM2), the operation sequence of the image sensor 600 may be maintained (e.g., OPSEQ1); the operation sequence of the image sensor 600 may be changed (e.g., from OPSEQ1 to OPSEQ2) by the change of the operation mode of the image sensor 600 (e.g., from OPM2 to OPM3). When the operation sequence is maintained, a control time interval may also be maintained; when the operation sequence is changed, the control time interval may be changed.

Referring to FIGS. 11B and 12B, the operation schedule information OPSIb may include an operation mode, an operation sequence, and a control time interval and may further include a target digital circuit.

In an embodiment, the target digital circuit may be a result of classifying the one or more digital circuits 631-11 to 631-13 and 631-21 to 631-23 into a first digital circuit block and a second digital circuit block based on a result of a statistical analysis associated with a noise characteristic of an analog signal processing circuitry and one or more of a result of calculating spatial distances on the analog signal processing circuitry. For example, the target digital circuit may indicate only digital circuits included in the first digital circuit block.

In an embodiment, the operation mode may include operation modes OPM1, OPM2, OPM3, and OPM4, the operation sequence may include operation sequences OPSEQ1, OPSEQ2, and OPSEQ3, and the control time interval may include control time intervals CTINV1, CTINV2, and CTINV3.

In an embodiment, the target digital circuit may be indicated by indexes "1" to "6" capable of independently identifying the one or more digital circuits 631-11 to 631-13 and 631-21 to 631-23; the target digital circuit may be indicated by indexes "1", "2", and "4" indicating the digital circuits 631-11, 631-12, and 631-21 with regard to the control time interval CTINV1; the target digital circuit may be indicated by the indexes "1", and "2" indicating the digital circuits 631-11 and 631-12 with regard to the control time interval CTINV2; the target digital circuit may be indicated in a manner similar to that of each of the control time intervals CTINV1 and CTINV2 with regard to the control time interval CTINV3. For example, when the target digital circuit is controlled by each of the control time intervals CTINV1 to CTINV3, one or more clock signals or one or more power signals provided to digital circuits indicated by the target digital circuit may be blocked in each of the control time intervals CTINV1 to CTINV3.

Figure 13:
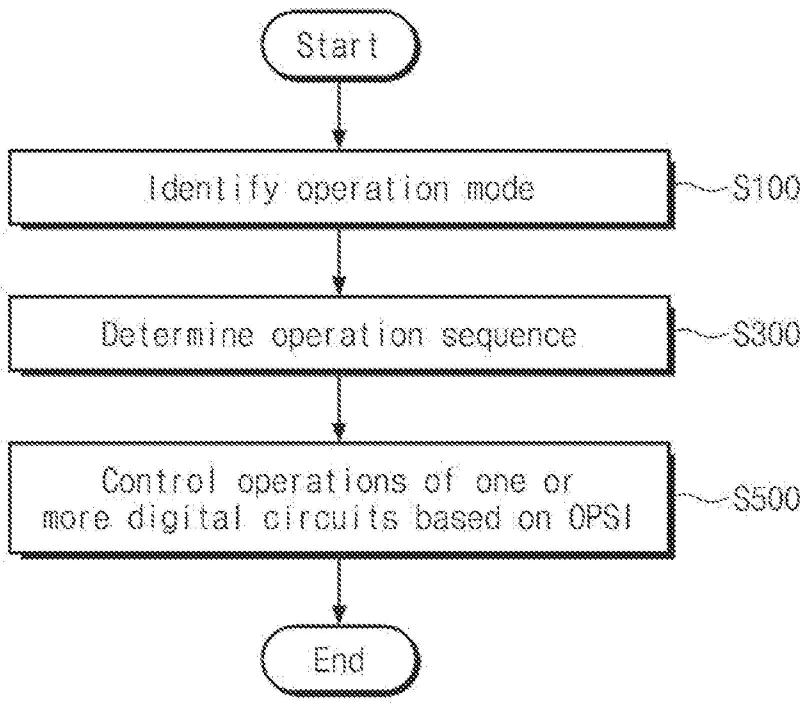
FIGS. 13 and 14 are flowcharts illustrating an operating method of an image sensor according to an embodiment of the present disclosure.
Figure 14:
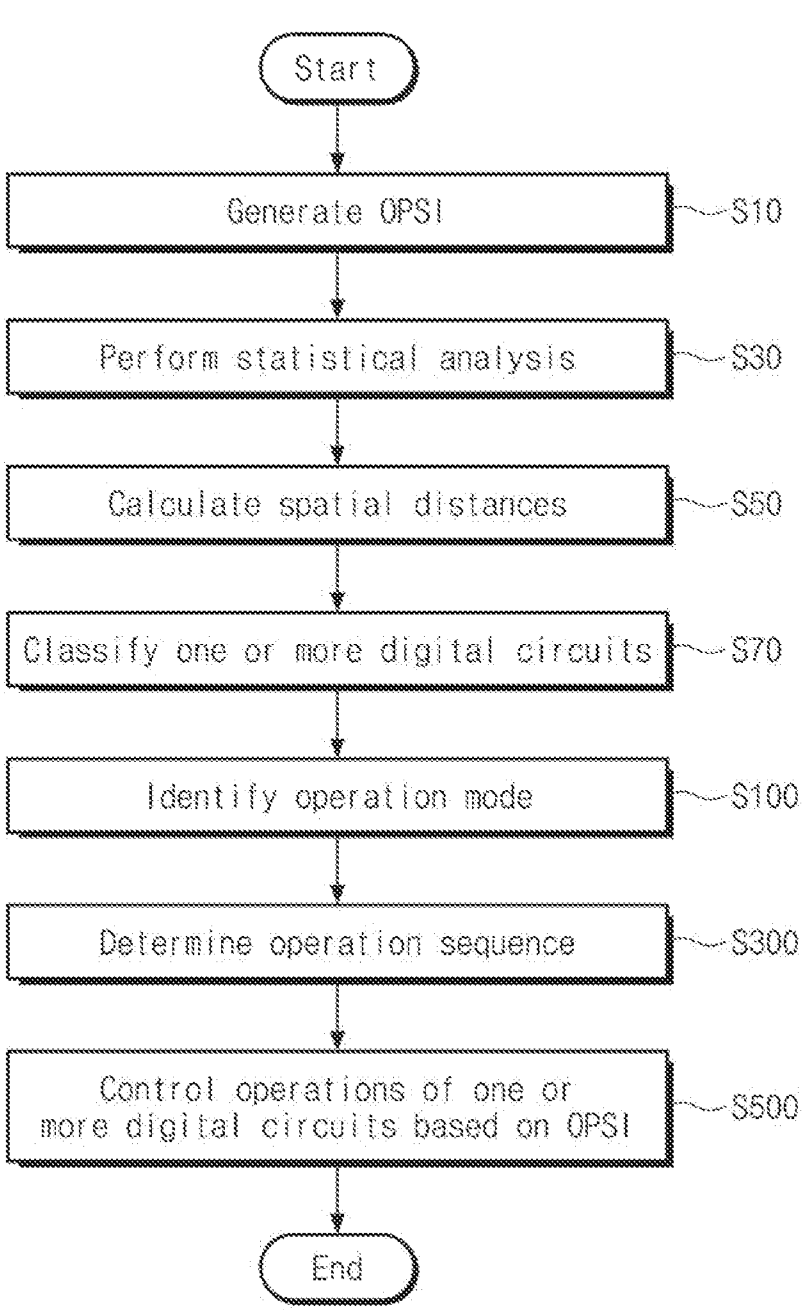

FIGS. 13 and 14 are flowcharts illustrating an operating method of an image sensor according to an embodiment of the present disclosure.

In FIGS. 13 and 14, each operation may be performed by a control circuit (e.g., 150 of FIG. 1) or an application processor (e.g., 300 of FIG. 1).

Referring to FIG. 13, in the operating method of the image sensor, an operation mode of the image sensor may be identified (S100).

An operation sequence may be determined based on the operation mode (S300).

Operations of one or more digital circuits may be controlled based on operation schedule information including a control time interval associated with the operation sequence (S500).

In an embodiment, the controlling of the operations of the one or more digital circuits may include blocking only a clock signal or a power signal provided to the first digital circuit block.

Referring to FIGS. 13 and 14, in the operating method of the image sensor, the operation schedule information may be generated before performing operation S100, operation S300, and operation S500 (S10).

A statistical analysis associated with a noise characteristic of an analog signal processing circuitry may be performed (S30).

Spatial distances between the analog signal processing circuitry and the one or more digital circuits may be calculated (S50).

The one or more digital circuits may be classified into the first digital circuit block and the second digital circuit block based on one or more of a result of the statistical analysis and a calculation result of the spatial distances (S70).

Figure 15:
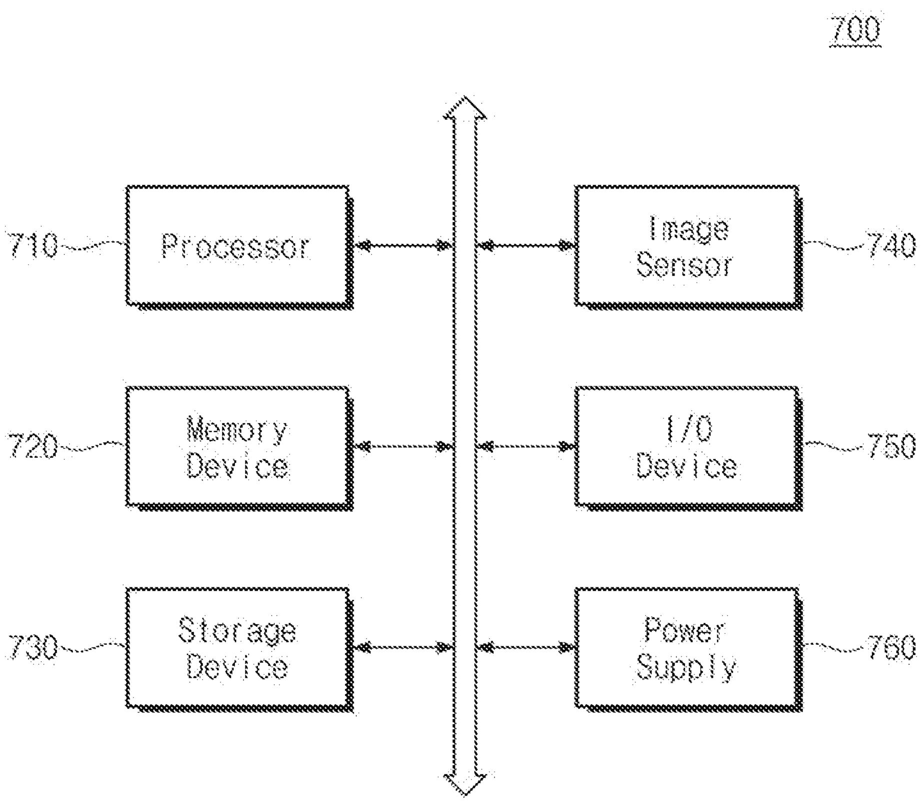
FIG. 15 is a block diagram illustrating a computing system including an image sensor according to embodiments of the present disclosure.

FIG. 15 is a block diagram illustrating a computing system including an image sensor according to embodiments of the present disclosure.

Referring to FIG. 15, a computing system 700 may include a processor 710, a memory device 720, a storage device 730, an image sensor 740, an input/output device 750, and a power supply 760. The computing system 700 may communicate with a video card, a sound card, a memory card, a USB device, etc. or may further include ports capable of communicating with any other electronic devices.

The processor 710 may perform specific calculations or tasks. In an embodiment, the processor 710 may be a micro-processor or a central processing unit (CPU). For example, the processor 710 may include an application processor (e.g., 300 of FIG. 1). Accordingly, the processor 710 may provide the operation mode information OPMDI to the image sensor 740 and may receive the digital data DD from the image sensor 740.

The processor 710 may communicate with the memory device 720, the storage device 730, the image sensor 740, and the input/output device 750 through an address bus, a control bus, and a data bus.

In an embodiment, the processor 710 may also be connected to an expansion bus such as a peripheral component interconnect (PCI) bus.

The memory device 720 may store data necessary for the operation of the computing system 700. For example, the memory device 720 may be implemented with a dynamic RAM (DRAM), a mobile DRAM, a static RAM (SRAM), a phase change RAM (PRAM), a ferroelectric RAM (FRAM), a resistive RAM (RRAM), and/or a magnetoresistive RAM (MRAM).

The storage device 730 may include a solid state drive (SSD), a hard disk drive (HDD), a CD-ROM, etc. The input/output device 750 may include input devices such as a keyboard, a keypad, and a mouse and output devices such as a printer and a display. The power supply 760 may supply an operating voltage necessary for the operation of the computing system 700.

The image sensor 740 may be connected to the processor 710 through the buses or any other communication link and may perform communication. The image sensor 740 may operate based on the configuration and operations described with reference to FIGS. 1, 3, and 5.

Figure 16:
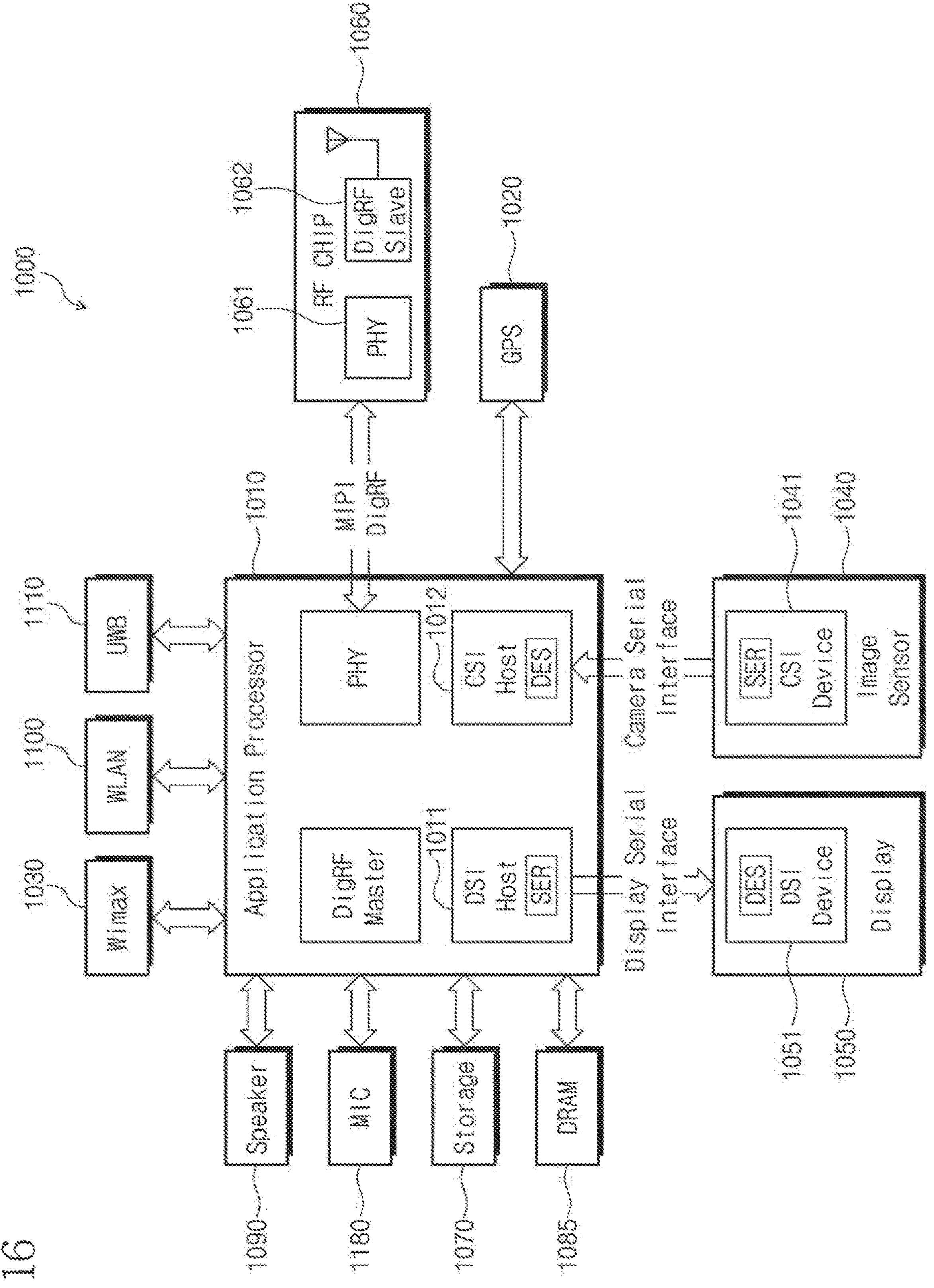
FIG. 16 is a block diagram illustrating an electronic system including an image sensor according to embodiments of the present disclosure.

FIG. 16 is a block diagram illustrating an electronic system including an image sensor according to embodiments of the present disclosure.

Referring to FIG. 16, an electronic system 1000 may be implemented with a data processing device capable of using or supporting an MIPI interface and may include an applications processor 1010, an image sensor 1040, a display 1050, etc. The electronic system 1000 may further include an RF chip 1060, a GPS 1020, storage 1070, a microphone 1180, a DRAM 1085, and a speaker 1090 and may perform communication by using a UWB 1110, a WLAN 1100, a WIMAX 1030, etc.

The applications processor 1010 may refer to a controller or a processor that controls operations of the image sensor 1040 and the display 1050. The application processor 1010 may correspond to the application processor 300 of FIG. 1.

The applications processor 1010 may include a DSI host 1011 communicating with a DSI device 1051 of the display 1050, a CSI host 1012 communicating with a CSI device 1041 of the image sensor 1040, a PHY exchanging data with a PHY 1061 of the RF chip 1060 in compliance with DigRF, and a DigRF master controlling a DigRF slave 1062 of the RF chip 1060.

In an embodiment, the DSI host 1011 may include an optical serializer SER, and the DSI device 1051 may include an optical deserializer DES. In an embodiment, the CSI host 1012 may include an optical deserializer DES, and the CSI device 1041 may include an optical serializer SER.

The image sensor 1140 may be the image sensor according to embodiments of the present disclosure and may operate based on the operating method according to embodiments of the present disclosure.

In an embodiment, the electronic system 1000 may be an electronic system such as a personal computer (PC), a workstation, a laptop, a cellular phone, a smart phone, an MP3 player, a PDA (Personal Digital Assistant), a PMP (Portable Multimedia Player), a digital TV, a digital camera, a portable game console, a navigation system, a wearable device, an IoT (Internet of Things) device, an IoE (Internet of Everything) device, an e-book, a VR (Virtual Reality) device, an AR (Augmented Reality) device, or a drone.

As described above, an image sensor according to embodiments of the present disclosure may improve a noise characteristic of an analog signal processing circuitry by blocking one or more clock signals or one or more power signals to be provided to a digital data processing circuitry of the image sensor during a control time interval.

The image sensor may perform pre-scheduled operations every given time interval (e.g., a “unit time interval”) until an operation mode or an operation sequence is changed, and the control time interval may be defined in advance as a portion of the unit time interval. Accordingly, depending on a predefined schedule, the image sensor according to an embodiment of the present disclosure may improve a noise characteristic of the analog signal processing circuitry and may reduce power consumption, without checking detailed states of various circuits included in the analog signal processing circuitry or the digital signal processing circuitry in real time.

An image sensor according to embodiments of the present disclosure may improve a noise characteristic of an analog signal processing circuitry by blocking one or more clock signals or one or more power signals to be provided to a digital data processing circuitry of the image sensor during a control time interval.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An image sensor comprising:

an analog signal processing circuitry configured to process analog signals and to output digital signals;

a digital data processing circuitry comprising one or more digital circuits configured to process the digital signals; and a control circuit configured to control operations of the one or more digital circuits based on operation schedule information, wherein the operation schedule information comprises one or more control time intervals associated with one or more operation sequences of the image sensor, wherein the image sensor is configured to operate in one or more reset time intervals and one or more signal time intervals, wherein a first operation sequence among the one or more operation sequences indicates a chronological order of a first reset time interval among the one or more reset time intervals and a first signal time interval among the one or more signal time intervals, wherein the operation schedule information comprises a first control time interval among the one or more control time intervals, and the first control time interval is associated with the first operation sequence, and wherein the first control time interval comprises a portion of the first reset time interval or a portion of the first signal time interval.

2. The image sensor of claim 1, wherein each of the one or more operation sequences indicates a chronological order of the one or more reset time intervals and the one or more signal time intervals.

3. The image sensor of claim 1, wherein the analog signal processing circuitry comprises one or more analog-to-digital converters configured to generate the digital signals, wherein the control circuit is configured to provide an auto-zero control signal, a counter enable signal, and a counter clock signal to each of the one or more analog-to-digital converters, and wherein the first control time interval is set based on one or more of the auto-zero control signal, the counter enable signal, and the counter clock signal.

4. The image sensor of claim 3, wherein the first control time interval is set based on one or more of a first point in time when the auto-zero control signal is disabled, a second point in time when the counter enable signal is enabled, and a third point in time when the counter clock signal is applied.

5. The image sensor of claim 4, wherein the first control time interval is set based on temporal distances from one or more of the first point in time, the second point in time, and the third point in time.

6. The image sensor of claim 1, wherein the analog signal processing circuitry comprises a ramp generator configured to generate a ramp signal, and wherein the first control time interval is set based on the ramp signal.

7. The image sensor of claim 6, wherein the first control time interval is set within the first reset time interval or the first signal time interval, based on a first point in time when a slope of the ramp signal changes.

8. The image sensor of claim 7, wherein a length of the first control time interval is inversely proportional to an absolute value of the slope of the ramp signal.

9. The image sensor of claim 1, wherein the first control time interval further includes a time interval immediately before the first reset time interval or a time interval immediately before the first signal time interval.

10. The image sensor of claim 1, wherein the control circuit is further configured to:

provide one or more clock signals to the one or more digital circuits; and block at least one of the one or more clock signals in each of the one or more control time intervals.

11. The image sensor of claim 10, wherein the one or more digital circuits are classified into a first digital circuit block and a second digital circuit block based on a statistical analysis associated with a noise characteristic of the analog signal processing circuitry, and wherein the control circuit is further configured to block only a clock signal to be provided to the first digital circuit block.

12. The image sensor of claim 10, wherein the one or more digital circuits are classified into a first digital circuit block and a second digital circuit block, based on spatial distances between each of the one or more digital circuits and the analog signal processing circuitry, and wherein the control circuit is further configured to block only a clock signal, from among the one or more clock signals, to be provided to the first digital circuit block.

13. The image sensor of claim 10, wherein the operation schedule information further comprises a result of classifying the one or more digital circuits into a first digital circuit block and a second digital circuit block, based on one or more of a result of a statistical analysis associated with a noise characteristic of the analog signal processing circuitry and a calculation result of spatial distances between each of the one or more digital circuits and the analog signal processing circuitry.

14. The image sensor of claim 1, wherein the control circuit is further configured to, based on an operation sequence of the image sensor being changed by a change of an operation mode of the image sensor, control operations of the one or more digital circuits based on a control time interval associated with the changed operation mode.

15. A method of operating an image sensor, the method comprising:

identifying an operation mode of the image sensor;

determining an operation sequence based on the operation mode;

controlling operations of one or more digital circuits of the image sensor based on operation schedule information comprising a control time interval associated with the operation sequence;

performing a statistical analysis associated with a noise characteristic of an analog signal processing circuitry of the image sensor;

calculating spatial distances between the analog signal processing circuitry and the one or more digital circuits; and classifying the one or more digital circuits into a first digital circuit block and a second digital circuit block based on one or more of a result of the statistical analysis and a result of calculating the spatial distances.

16. The method of claim 15, wherein the controlling operations of the one or more digital circuits comprises:

blocking only a clock signal to be provided to the first digital circuit block.

17. The method of claim 15, wherein the image sensor is configured to operate in one or more reset time intervals and one or more signal time intervals, and wherein the operation sequence indicates a chronological order of the one or more reset time intervals and the one or more signal time intervals.

18. An image sensor comprising:

an analog signal processing circuitry, the analog signal processing circuitry comprising:

a pixel array;

an analog-to-digital signal converter; and a ramp generator;

a digital data processing circuitry comprising one or more digital circuits; and a control circuit, wherein the analog signal processing circuitry is configured to process an analog signal generated by the pixel array and to output a digital signal, wherein the one or more digital circuits are configured to store the digital signal and perform image signal processing to enhance a characteristic of the digital signal, wherein the one or more digital circuits are classified into a first digital circuit block and a second digital circuit block based on a statistical analysis associated with a noise characteristic of the analog signal processing circuitry, and wherein the control circuit is configured to:

control operations of the one or more digital circuits based on operation schedule information, wherein the operation schedule information comprises one or more control time intervals associated with one or more operation sequences of the image sensor, provide one or more clock signals to the one or more digital circuits, and block a clock signal to be provided to the first digital circuit block.

* * * * *